(12) United States Patent
Hayashi

(10) Patent No.: US 6,665,153 B1
(45) Date of Patent: Dec. 16, 2003

(54) MAGNETORESISTANCE ELEMENT, HEAD, SENSING SYSTEM, AND MAGNETIC STORING SYSTEM

(75) Inventor: Kazuhiko Hayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 457 days.

(21) Appl. No.: 09/626,822

(22) Filed: Jul. 27, 2000

(30) Foreign Application Priority Data

Jul. 28, 1999 (JP) .......................................... 11-212993

(51) Int. Cl.[7] ................................................. G11B 5/39
(52) U.S. Cl. ....................................................... 360/322
(58) Field of Search ............................... 360/314, 322, 360/315, 324.12, 324.11

(56) References Cited

U.S. PATENT DOCUMENTS

| | | | | |
|---|---|---|---|---|
| 5,701,222 A | * | 12/1997 | Gill et al. ..................... | 360/314 |
| 5,768,069 A | * | 6/1998 | Mauri ......................... | 360/314 |
| 5,828,525 A | * | 10/1998 | Iwasaki et al. .............. | 360/314 |
| 5,946,167 A | * | 8/1999 | Hara et al. ................... | 360/322 |
| 6,162,582 A | * | 12/2000 | Hsiao et al. ................. | 430/312 |
| 6,307,721 B1 | * | 10/2001 | Chen et al. .................. | 360/316 |
| 6,456,468 B1 | * | 9/2002 | Hayashi .................... | 360/324.1 |

FOREIGN PATENT DOCUMENTS

| JP | 2-61572 | 3/1990 |
|---|---|---|
| JP | 4-358310 | 12/1992 |
| JP | 6-203340 | 7/1994 |
| JP | 7-296333 | 11/1996 |
| JP | 9-282618 | 10/1997 |

OTHER PUBLICATIONS

David A. Thompson, et al., "Thin Film Magnetoresistors in Memory, Storage, and Related Applications", IEEE Transactions of Magnetics, vol. Mag–11, No. 4, Jul. 1975, pp. 1,039–1,050.

* cited by examiner

*Primary Examiner*—Robert S. Tupper
(74) *Attorney, Agent, or Firm*—Choate, Hall & Stewart

(57) ABSTRACT

A MR element is provided, which allows the sense current to flow through only the inner region of a MR layer to bypass its end regions, thereby realizing high magnetic sensitivity and good domain control in the sensing region. The element comprises (a) a MR layer having a width corresponding to a recording track width of an applicable magnetic recording medium; (b) a pair of vertical biasing layers disposed at each side of the MR layer to be overlapped with each end of the MR layer; inner opposing ends of the pair of vertical biasing layers being contacted with the MR layer; (c) a pair of dielectric layers formed on the pair of biasing layers; inner opposing ends of the pair of dielectric layers being contacted with the MPR layer; and (d) a pair of electrode layers formed on the pair of dielectric layers; inner opposing ends of the pair of electrode layers being contacted with the MR layer, thereby electrically connecting the pair of electrode layers to the MR layer; a distance between the inner opposing ends of the pair of electrode layers being smaller than a width of the MR layer. The pair of electrode layers may be completely separated from the pair of vertical biasing layers by the pair of dielectric layers or contacted with the pair of vertical biasing layers by way of openings in the pair of dielectric layers.

9 Claims, 19 Drawing Sheets

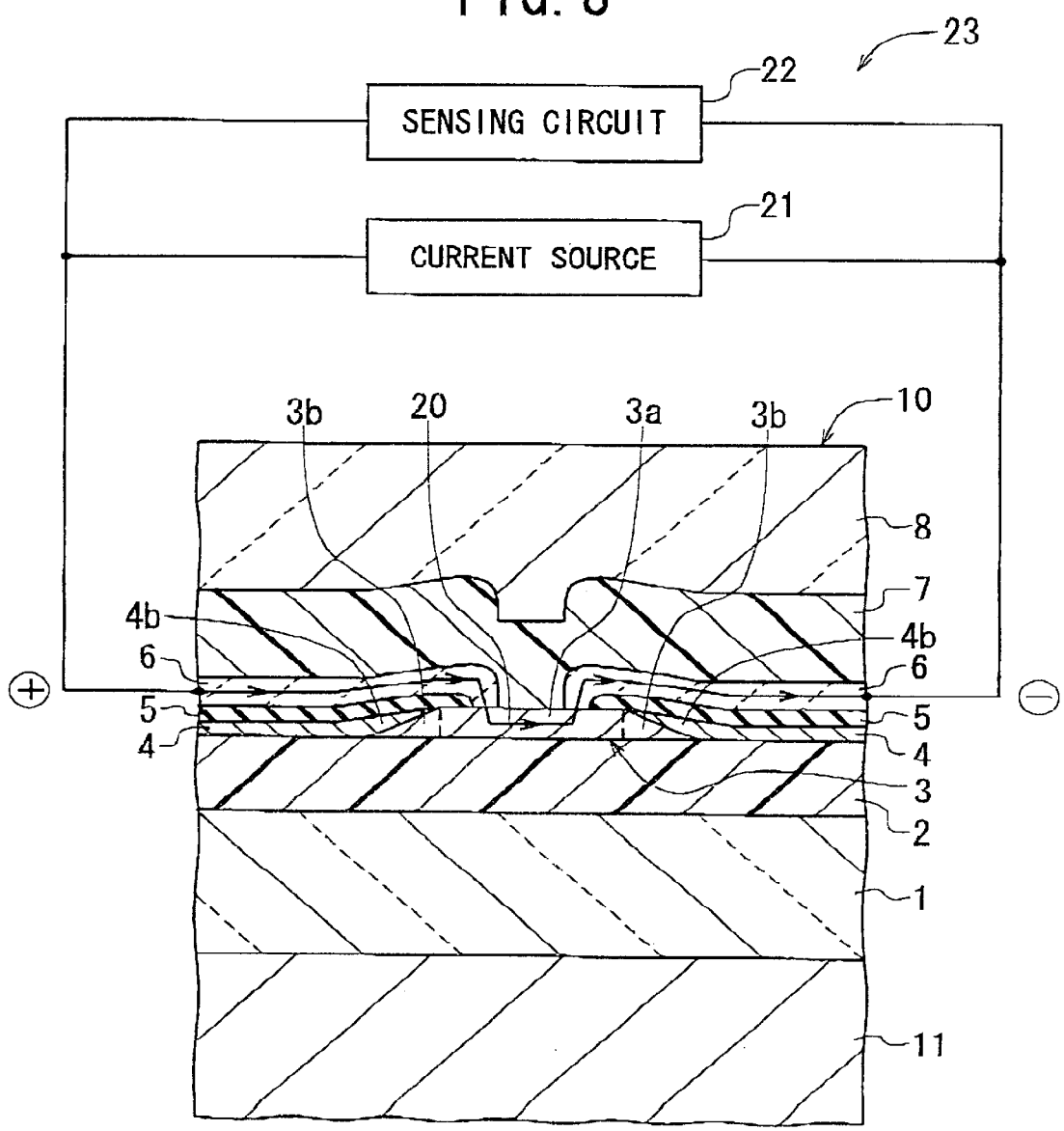

MAGNETORESISTANCE ELEMENT, HEAD, SENSING SYSTEM, AND MAGNETIC STORING SYSTEM

BACKGROUND OF THE INVENTION

1. Field of the Invention

The present invention relates to an improvement of a magnetic sensor for reading the information recorded in magnetic recording media. More particularly, the invention relates to an improvement of a magnetoresistance element and head, a magnetoresistance sensing system, and a magnetic storing system.

2. Description of the Related Art

In the magnetic recording fields, conventionally, magnetoresistive (MR) read transducers termed the "magnetoresistance (MR) sensors" or "magnetoresistance (MR) heads" have already been developed and actually used. It has been well known that the MR sensors are capable of reading information from the surface of magnetic recording media at high linear densities.

The MR sensors sense magnetic signals by way of the electrical resistance change of MR elements that varies as a function of the strength and orientation of the magnetic flux sensed by read or MR elements. The MR sensors operate on the basis of the well-known anisotropic magnetoresistance (AMR) effect that a component of the electrical resistance of the MR element varies proportional to the square or the cosine one of the angle between the magnetization orientation of the element and the sense current flowing through the element.

The AMR effect was explained in detail in the paper written by D. A. Thompson et al. and entitled "Memory, Storage, and Related Applications", IEEE Transaction on Magnetics, Vol. MAG-11, No. 4, pp. 1039–1050, July 1975.

With the conventional magnetic sensors using the AMR effect, vertical magnetic bias has been typically applied to suppress the Barkhausen noise. To realize the vertical magnetic bias, proper antiferromagnetic substance, such as FeMn, NiMn, or oxide of Ni, has been often used as the vertically biasing material.

In recent years, more distinctive MR effect termed the "giant MR effect (GMR)" or "spin valve effect" observed in multi-layered MR sensors of specific sorts has been reported. It has been said that the GMR or spin valve effect is caused by the following reason.

Specifically, if the multi-layered MR sensor has a structure comprising a pair of ferromagnetic layers and a nonmagnetic layer disposed between the pair of ferromagnetic layers, the large electrical resistance change of the MR sensor is due to the spin-dependent transmission of conduction electrons between the pair of ferromagnetic layers by way of the nonmagnetic layer and the spin-dependent scattering at their interfaces accompanied by the spin-dependent transmission.

MR sensors using the GMR effect have improved sensitivity compared with those using the AMR effect, increasing the electrical resistance change of the sensors. When the MR sensor has the above-identified structure comprising a pair of ferromagnetic layers and a nonmagnetic layer disposed between the pair of ferromagnetic layers, it has been found that the in-plane electrical resistance of the sensor is proportional to the cosine of the angle between the magnetization orientations of the pair of ferromagnetic layers.

Concrete configurations of the conventional MR sensors or heads using the GMR or spin valve effect have been disclosed in the following publications.

The Japanese Non-Examined Patent Publication No. 2-61572 published in March 1990 disclosed a MR sensor having a multi-layered structure of at least two ferromagnetic layers and an intermediate layer, which generates large electrical resistance change due to antiparallel arrangement of magnetization in the ferromagnetic layers. As the magnetic layers, several ferromagnetic transition metals and alloys are disclosed. An antiferromagnetic layer, which is preferably made of FeMn, may be formed to contact with one of the ferromagnetic layers.

The Japanese Non-Examined Patent Publication No. 4-358310 published in December 1992 disclosed a MR sensor having a multi-layered structure of a pair of ferromagnetic layers and an intervening nonmagnetic layer. In this sensor, when the applied external magnetic field has a value of zero, the magnetization orientations of the pair of ferromagnetic layers are perpendicular to each other. The electrical resistance of the MR sensor varies proportional to the cosine of the angle between the magnetization orientations of the pair of ferromagnetic layers and is independent upon the orientation of the current flowing through the sensor.

The Japanese Non-Examined Patent Publication No. 6-203340 published in July 1994 disclosed a MR sensor having a multi-layered structure of a pair of ferromagnetic layers and an intervening nonmagnetic layer. In this sensor, the magnetization easy axes of the pair of ferromagnetic layers are substantially parallel to each other. When an external magnetic field is applied, the induced magnetization orientations of the pair of ferromagnetic layers are shifted in opposite directions to each other with respect to their magnetization easy axes.

The Japanese Non-Examined Patent Publication No. 9-282618 published in October 1997 disclosed a MR head having a MR or spin valve layer with a multi-layered structure, a pair of domain control layers disposed at each side of the MR layer, and a pair of electrodes disposed on the pair of domain control layers and electrically connected to the MR layer. In this head, the MR layer has a size corresponding to the track width of a magnetic recording medium. The pair of electrodes are partially overlapped with the MR layer. The distance between the pair of electrodes is narrower than the width of the MR layer.

FIG. 1 shows an example of the configuration of the prior-art MR heads, which is a cross-sectional view taken along the Air Bearing Surface (ABS).

As shown in FIG. 1, the prior-art MR head 110 comprises a lower shielding layer 101 formed on the surface of a substrate 111. A lower gap layer 102 is formed on the lower shielding layer 101. A MR layer 103 and a pair of vertical biasing layers 104 are selectively formed on the lower gap layer 102.

The MR layer 103 has an approximately trapezoidal cross section, as shown in FIG. 1. The width of the MR layer 103 is approximately equal to the track width of applicable magnetic recording media (not shown).

The pair of vertical biasing layers 104 are disposed at each side of the MR layer 103. The inner opposing ends of the biasing layers 104 are respectively overlapped with and contacted with the corresponding inclined ends of the MR layer 103.

A pair of electrode layers 106 are formed on the pair of biasing layers 104 and the MR layer 103. The inner opposing ends of the electrode layers 106 are apart from each other by the intervening gap and are contacted with the upper surface of the MR layer 103, thereby electrically connecting the electrode layers 106 to the layer MR 103. The middle region of the MR layer 103 in its widthwise direction is exposed through the gap intervening between the electrode layers 106.

The MR layer 103, the pair of biasing layers 104 and the pair of electrode layers 106 constitute a MR element 109.

An upper gap layer 107 is formed on the pair of biasing layers 104 and the exposed MR layer 103. The exposed middle region of the MR layer 103 is covered with the upper gap layer 107. An upper shielding layer 108 is formed on the upper gap layer 107.

The lower shielding layer 101, the lower gap layer 102, the MR element 109, the upper gap layer 107, and the upper shielding layer 108 constitute the prior-art MR head 110.

With the prior-art MR head 110, the inner opposing ends of the electrode layers 106 are disposed to be nearer to the middle of the MR layer 103 than the contacting parts of the vertical biasing layers 104 with the MR layer 103. In other words, when the centerline of the MR layer 103, which corresponds to the centerline of applicable magnetic recording media in the tracking direction, is defined as C, as shown in FIG. 1, the innermost edges of the electrode layers 106 are located to be nearer than the innermost edges of the biasing layers 104 in the MR element 109.

Accordingly, with the MR element 109 having the above-described configuration, the magnetization of the MR layer 103 is fixed in its innermost edges by the biasing layers 104, thereby eliminating the sensitivity of the element 109 to the leakage magnetic field from the magnetic recording media. In other words, since the MR layer 103 that serves as the magnetic sensing region is domain-controlled, the Barkhausen noise is suppressed. Also, the sense current supplied by the electrode layers 106 flows through only the vicinity of the middle region of the MR layer 103 without flowing through its end regions (i.e., with bypassing its end regions). As a result, high magnetic sensitivity is realized and thus, the output of the reproduction head (i.e., the reproduction output) is enlarged. In this way, high magnetic sensitivity and good domain control in the sensing region can be realized, thereby raising the reproduction output with suppressing the Barkhausen noise.

However, when the inventor, K. Hayashi, actually produced the above-described prior-art MR head 110 and examined its operation and performance, he found that the sense current tended to flow through nor only the middle region of the MR layer 103 but also its outer regions. As a result, the effective track width of the MR head 110 that serves as the reproduction head is wider than the distance between the inner opposing edges of the electrode layers 106 (i.e., the interval between the electrode layers 106). This raises a problem that narrowing of the effective track width is difficult to realized.

SUMMARY OF THE INVENTION

Accordingly, an object of the present invention is to provide a MR element and a MR head that allow the sense current to flow through only the middle part of the inner region of a MR layer and its vicinity to bypass its end regions, thereby realizing high magnetic sensitivity and good domain control in the sensing region.

Another object of the present invention is to provide a MR element, a MR head, a MR sensing system, and a magnetic recording system that suppress the increase of the effective track width, thereby narrowing the read track easily.

Still another object of the present invention is to provide a MR element, a MR head, a MR sensing system, and a magnetic recording system that suppress effectively the Barkhausen noise even if the effective reproduction track width is narrowed.

The above objects together with others not specifically mentioned will become clear to those skilled in the art from the following description.

According to a first aspect of the present invention, a MR element is provided, which comprises;

(a) a MR layer having a width corresponding to a recording track width of an applicable magnetic recording medium;

(b) a pair of vertical biasing layers disposed at each side of the MR layer to be overlapped with each end of the MR layer;
   inner opposing ends of the pair of vertical biasing layers being contacted with the MR layer;

(c) a pair of dielectric layers formed on the pair of biasing layers;
   inner opposing ends of the pair of dielectric layers being contacted with the MR layer; and (d) a pair of electrode layers formed on the pair of dielectric layers;
   inner opposing ends of the pair of electrode layers being contacted with the MR layer, thereby electrically connecting the pair of electrode layers to the MR layer;
   a distance between the inner opposing ends of the pair of electrode layers being smaller than a width of the MR layer.

With the MR element according to the first aspect of the present invention, the pair of vertical biasing layers are disposed at each side of the MR layer to be overlapped with each end of the MR layer and the inner opposing ends of the pair of vertical biasing layers are contacted with the MR layer. The pair of dielectric layers are formed on the pair of biasing layers and the inner opposing ends of the pair of dielectric layers are contacted with the MR layer. The pair of electrode layers are formed on the pair of dielectric layers and the inner opposing ends of the pair of electrode layers are contacted with the MR layer, thereby electrically connecting the pair of electrode layers to the MR layer. The distance between the inner opposing ends of the pair of electrode layers is smaller than a width of the MR layer.

Accordingly, the sense current, which flows through the pair of electrode layers and the MR layer, does not enter the one of the two end regions of the MR layer and does not exit out of the other directly or by way of the pair of vertical biasing layers.

On the other hand, the inner opposing ends of the pair of vertical biasing layers are contacted with the end regions of the MR layer and therefore, the orientation of magnetization is fixed and the sensitivity to an external magnetic flux is zero in the end regions of the MR layer. Unlike this, the sensitivity to an external magnetic flux of the MR layer increases gradually toward its center and thus, it is high in the middle part of the inner region of the MR layer while it is intermediate in its intermediate regions between the middle part and each end region.

Moreover, because the inner opposing ends of the pair of dielectric layers are contacted with the MR layer, the possibility that the sense current enters the intermediate regions of the MR layer having an intermediate sensitivity to an external magnetic flux is approximately cancelled.

As a result, the sense current is controlled or guided to flow through the middle part or the inner region of the MR layer having a high sensitivity to an external magnetic flux.

This means that the output of the MR layer is increased and at the same time, the effective reproducing track width is narrowed (i.e., the track density is increased).

In addition, since the inner opposing ends of the pair of vertical biasing layers are contacted with the MR layer, the dynamic coercive force of the MR layer is suppressed sufficiently. Thus, good domain control is accomplished and the Barkhausen noise is effectively suppressed.

According to a second aspect of the present invention, another MR element is provided, which comprises:

(a) a MR layer;

(b) a pair of vertical biasing layers disposed at each side of the MR layer to be overlapped with each end of the MR layer;
inner opposing ends of the pair of vertical biasing layers being contacted with the MR layer;

(c) a pair of electrode layers formed on the pair of biasing layers;
innermost ends of the pair of electrode layers being located more inwardly than innermost ends of the pair of vertical biasing layers;
the pair of electrode layers being electrically connected to the MR layer;

(d) a pair of dielectric layers formed to overlap with the pair of biasing layers and the MR layer;
each of innermost ends of the pair of dielectric layers being located between one of the innermost ends of the pair of electrode layers and a corresponding one of the innermost ends of the pair of vertical biasing layers.

With the MR element according to the second aspect of the present invention, because of substantially the same reason as that of the MR element according to the first aspect, the same advantages as those in the MR element of the first aspect are given.

According to a third aspect of the present invention, a MR head is provided, which comprises:

(a) a lower shielding layer formed on a substrate;

(b) a lower dielectric gap layer formed on the lower shielding layer;

(c) the MR element according to the first or second aspect of the invention;

(d) an upper dielectric gap layer formed on the MR element; and (e) an upper shielding layer formed on the upper dielectric gap layer.

With the MR head according to the third aspect of the present invention, because of substantially the same reason as that of the MR element according to the first aspect, the same advantages as those in the MR element of the first aspect are given.

According to a fourth aspect of the present invention, a MR sensing system is provided, which comprises:

(a) the MR element according to the first or second aspect of the invention;

(b) means for generating a current flowing through the element;

(c) means for sensing an electrical resistance change of the element as a function of a magnetic field to be sensed by the element.

With the MR sensing system according to the fourth aspect of the present invention, because of substantially the same reason as that of the MR element according to the first aspect, the same advantages as those in the MR element of the first aspect are given.

According to a fifth aspect of the present invention, another MR sensing system is provided, which comprises:

(a) the MR head according to the third aspect of the invention;

(b) means for generating a current flowing through the element;

(c) means for sensing an electrical resistance change of the element as a function of a magnetic field to be sensed by the element.

With the MR sensing system according to the fifth aspect of the present invention, because of substantially the same reason as that of the MR element according to the first aspect, the same advantages as those in the MR element of the first aspect are given.

According to a sixth aspect of the present invention, a magnetic storing system is provided, which comprises:

(a) a magnetic recording subsystem for recording information in a magnetic recording medium having information-recording tracks;

(b) the MR sensing system according to the fourth or sixth aspect of the invention; and (c) actuator means for moving the magnetic recording subsystem and the MR sensing system to a selected one of the tracks of the medium;
the actuator means being associated with the magnetic recording subsystem and the MR sensing system.

With the magnetic storing system according to the sixth aspect of the present invention, because of substantially the same reason as that of the MR element according to the first aspect, the same advantages as those in the MR element of the first aspect are given.

BRIEF DESCRIPTION OF THE DRAWINGS

In order that the present invention may be readily carried into effect, it will now be described with reference to the accompanying drawings.

FIGS. 7A to 7J are schematic, partial plan view showing the process steps of fabricating the MR head according to the third embodiment of FIG. 5, respectively.

FIG. 8 is a schematic view showing the configuration of a MR sensing system according to a fourth embodiment of the invention.

DETAILED DESCRIPTION OF THE PREFERRED EMBODIMENTS

Figure 1:
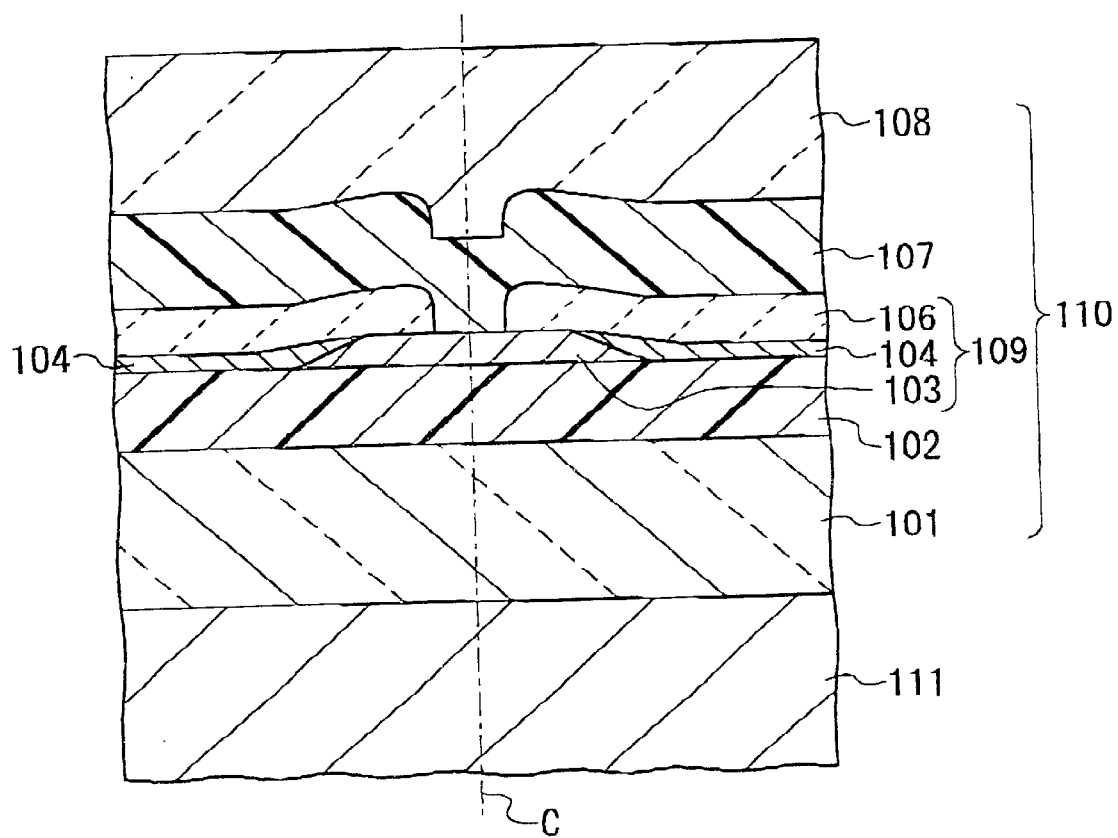
FIG. 1 is a schematic, partial cross-sectional view showing the configuration of a prior-art MR head, taking along the line parallel to the ABS.

Preferred embodiments of the present invention will be described in detail below while referring to the drawings attached.

First Embodiment

Figure 2:
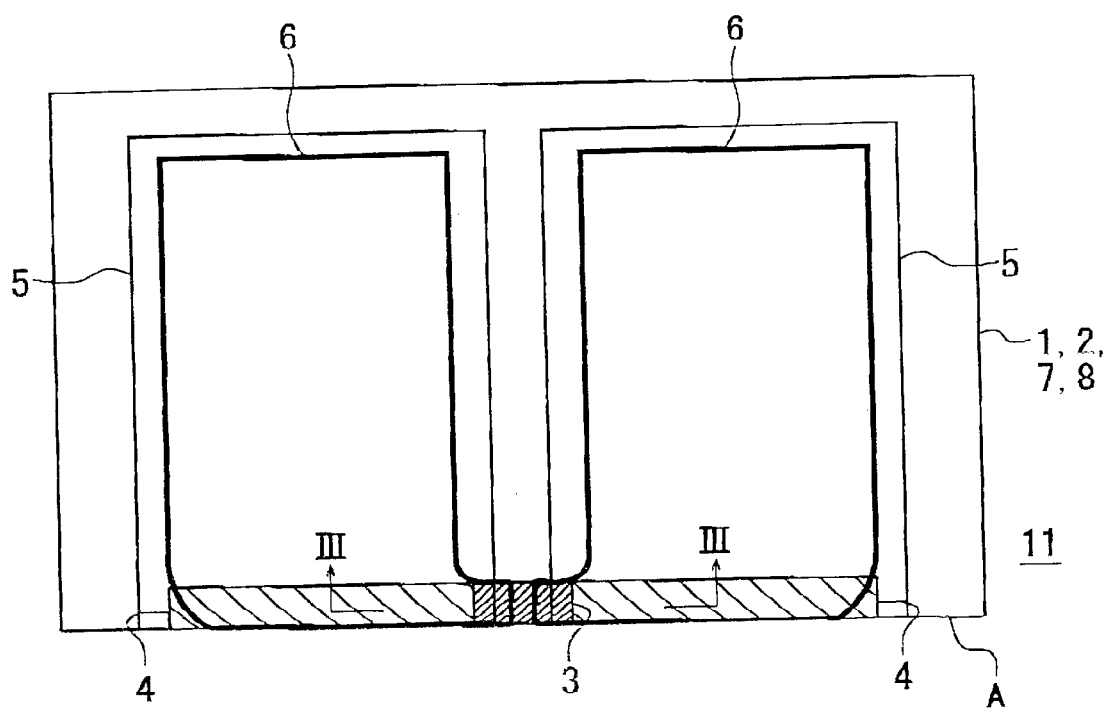
FIG. 2 is a schematic, partial plan view showing the configuration of a MR head according to a first embodiment of the invention.
Figure 3:
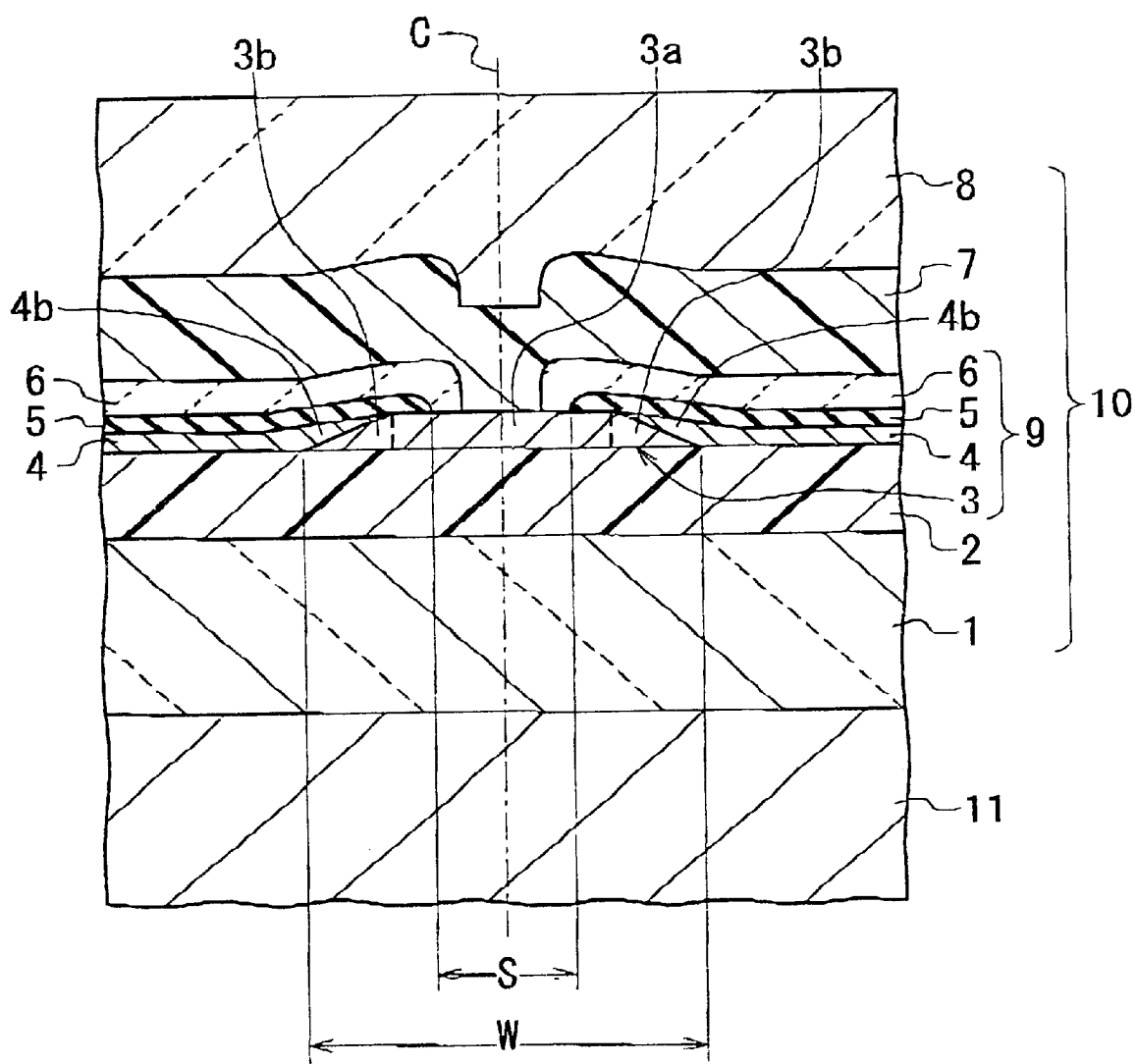
FIG. 3 is a schematic, partial cross-sectional view showing the configuration of the MR head according to the first embodiment of FIG. 2, taking along the line III—III in FIG. 2.

A MR head according to a first embodiment of the present invention is shown in FIGS. 2 and 3.

As shown in FIGS. 2 and 3, the MR head 10 according to the first embodiment comprises a lower shielding layer 1 formed on the surface of a substrate 11. The lower shielding layer 1 has an approximately rectangular plan shape. A lower gap layer 2 is formed on the lower shielding layer 1. A MR layer 3 and a pair of vertical biasing layers 4 are selectively formed on the lower gap layer 3.

The MR layer 3 has an approximately rectangular plan shape, as shown in FIG. 2. The MR layer 3 is located in such a way that one of the four sides of the layer 3 contacts with the Air Bearing Surface (ABS) A of the head 10. The MR layer 3 has an approximately trapezoidal cross section, as shown in FIG. 3. The width W of the MR layer 3 is approximately equal to the track width of applicable magnetic recording media (not shown).

Each of the pair of vertical biasing layers 4 has an approximately rectangular plan shape, as shown in FIG. 2. The biasing layers 4 are disposed at each side of the MR layer 3. The inner opposing end regions 4b of the biasing layers 4 are respectively overlapped with and contacted with the corresponding inclined or tapered end regions 3b of the MR layer 3.

A pair of dielectric layers 5 are formed on the pair of vertical biasing layers 4. Each of the pair of dielectric layers 5 has an approximately rectangular plan shape, as shown in FIG. 2. The pair of dielectric layers 5 is located to cover entirely the pair of the biasing layers 4 and partially the upper surface of the MR layer 3.

A pair of electrode layers 6 are formed on the pair of dielectric layers 5. Each of the electrode layers 6 has a plan shape like a L letter. The opposing inner end regions of the electrode layers 6 are apart from each other by the intervening gap and are contacted with the upper surface of each end part of the inner region 3a of the MR layer 3 (i.e., the intermediate region) in its widthwise direction, thereby electrically connecting the electrode layers 6 to the layer MR 3. The middle part of the inner region 3a of the MR layer 3 is partially exposed through the gap intervening between the electrode layers 6.

The MR layer 3, the pair of biasing layers 4, the pair of dielectric layers 5, and the pair of electrode layers 6 constitute a MR element 9.

An upper gap layer 7 is formed on the pair of vertical biasing layers 4 and the exposed MR layer 3 to entirely overlap with the underlying lower shielding layer 1. The exposed inner region 3a of the MR layer 3 is covered with the upper gap layer 7. An upper shielding layer 8 is formed on the upper gap layer 7 to entirely overlap with the upper shielding layer 7.

The lower shielding layer 1, the lower gap layer 2, the MR element 9, the upper gap layer 7, and the upper shielding layer 8 constitute the MR head 10.

As shown in FIG. 3, with the MR element 9, when the centerline C of the MR layer 3 in its widthwise direction that corresponds to the centerline of an applicable magnetic recording medium in its tracking direction is defined as the reference line, the nearest regions of the pair of electrode layers 6 to the centerline C are located nearer to the centerline C than the nearest regions of the pair of biasing layers 4. In other words, the innermost regions of the pair of electrode layers 6 are contacted with the surface of the MR layer 3 and at the same time, the distance or interval S between the pair of electrode layers 6 is smaller than the width W of the MR layer 3.

With the above-described MR head 10, the biasing layers 4 are entirely covered with the dielectric layers 5 to be electrically insulated from the electrode layers 6. Therefore, when a magnetic field is applied to the MR layer 3 serving as the sensing region, the sense current is substantially prevented from flowing into the end regions 3b of the MR layer 3 and to flow out of the same regions 3b, where the end regions 3b have no or low sensitivity to the applied magnetic field. In other words, the sense current tends to flow through the middle part of the inner region 3a of the MR layer 3 where the sensitivity to the applied magnetic field is high. As a result, the effective track width expansion can be suppressed and the track can be narrowed, which increases the reproduction output.

On the other hand, since the end regions 3b of the MR layer 3 are directly contacted with the vertical biasing layers 4, the dynamic coercive force of the MR layer 3 is well controlled to be small. This means that the domain control of the magnetic sensing region is ensured, suppressing the Barkhausen noise effectively.

The substrate 11, the lower shielding layer 1, the lower gap layer 2, the vertical biasing layers 4, the dielectric layers 5, the electrode layers 6, the upper gap layer 7, and the upper shielding layer 8 are preferably made of the following materials.

The substrate 11 may be made of altic, SiC, or alumina. It may be formed by a two-layered structure of altic and alumina layers (i/.e., altlic/alumina structure) or a two-layered structure of SiC and alumina layers (i.e., SiC/alumina structure).

The lower shielding layer 1 may be made of NiFe, CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi, or FeAlSi; iron nitride-system material; MnZn ferrite, NiZn ferrite, or MgZn ferrite. It may be made of a mixture of at least two ones of these materials. It may be formed by a multi-layered structure of sublayers made of at least two ones of those materials.

The electrode layers 6 may be made of Au, Ag, Cu, Mo, W, Y, Ti, Zr, Hf, V, Nb, Pt, or Ta. It may be made of a mixture of at least two ones of these materials. It may be formed by a multi-layered structure of sublayers made of at least two ones of these materials.

The dielectric layers 5 may be made of oxide of Al or Si; or aluminum nitride, silicon nitride, or diamond-like carbon. It may be made of a mixture of at least two ones of these materials. It may be formed by a multi-layered structure of sublayers made of at least two ones of these materials.

The lower gap layer 2 may be made of oxide of Al or Si; or aluminum nitride, silicon nitride, or diamond-like carbon. It may be made of a mixture of at least two ones of these materials. It may be formed by a multi-layered structure of sublayers made of at least two ones of these materials.

The upper gap layer 7 may be made of oxide of Al or Si; or aluminum nitride, silicon nitride, or diamond-like carbon. It may be made of a mixture of at least two ones of these materials. It may be formed by a multi-layered structure of sublayers made of at least two ones of these materials.

The vertical biasing layers 4 may be made of CoCrPt, CoCr, CoPt, CoCrTa, FeMn, or NiMn; or oxide of Ni, NiCo, Fe or NiFe; or IrMn, PtMn, PtPdMn, ReMn, Co ferrite, or Ba ferrite. It maybe made of a mixture of at least two ones of these materials. It may be formed by a multi-layered structure of sublayers made of at least two ones of these materials.

Preferably, the MR layer 3 may have any one of the following multi-layered structures (1) to (9).

(1) A substrate sublayer, an under sublayer, a free sublayer, a first MR enhancement sublayer, a nonmagnetic sublayer, a second MR enhancement sublayer, a pinned sublayer, a pinning sublayer, and a protection layer are stacked in this order, forming a multi-layered structure.

(2) A substrate sublayer, an under sublayer, a pinning sublayer, a pinned sublayer, a first MR enhancement sublayer, a nonmagnetic sublayer, a second MR enhancement sublayer, a free sublayer, and a protection layer are stacked in this order, forming a multi-layered structure (3) A combination of specific stacked sublayers are repeatedly stacked on a substrate sublayer N times, forming a multi-layered structure, where N is a number equal to or greater than unity. The combination of specific stacked sublayers is formed by an under sublayer, a free sublayer, a first MR enhancement sublayer, a nonmagnetic sublayer, a second MR enhancement sublayer, a pinnned sublayer, a pinning sublayer, and a protection layer stacked in this order.

(4) A combination of specific stacked sublayers are repeatedly stacked on a substrate sublayer N times, forming a multi-layered structure. The combination of specific stacked sublayers is formed by an under sublayer, a pinning sublayer, a pinned sublayer, a first MR enhancement sublayer, a nonmagnetic sublayer, a second MR enhancement sublayer, a free sublayer, and a protection layer are stacked in this order.

(5) A substrate sublayer, an under sublayer, a first pinning sublayer, a first pinned sublayer, a first MR enhancement sublayer, a nonmagnetic sublayer, a second MR enhancement sublayer, a free sublayer, a third MR enhancement sublayer, a nonmagnetic sublayer, a fourth MR enhancement sublayer, a second pinned layer, a second pinning sublayer, and a protection layer are stacked in this order, forming a multi-layered structure.

(6) A combination of specific stacked sublayers are repeatedly stacked over a substrate sublayer N times by way of an under layer, forming a multi-layered structure. The combination of specific stacked sublayers is formed by a pinned sublayer, a first MR enhancement sublayer, a nonmagnetic sublayer, a second MR enhancement sublayer, a free sublayer, a nonmagnetic sublayer stacked in this order. On the stacked combinations, a pinned layer and a protection layer are further stacked in this order.

(7) A combination of specific stacked sublayers are repeatedly stacked over a substrate sublayer N times by way of an under layer, forming a multi-layered structure. The combination of specific stacked sublayers is formed by a free sublayer, a first MR enhancement sublayer, a nonmagnetic sublayer, a second MR enhancement sublayer, a pinned sublayer, and a nonmagnetic sublayer stacked in this order. On the combination or the stacked combinations, a free layer and a protection layer are further stacked in this order.

(8) A substrate sublayer, an under sublayer, pinned sublayer, a first MR enhancement sublayer, a nonmagnetic sublayer, a second MR enhancement sublayer, a free sublayer, and a protection layer are stacked in this order, forming a multi-layered structure.

(9) A substrate sublayer, an under sublayer, a free sublayer, a first MR enhancement sublayer, a nonmagnetic sublayer, a second MR enhancement sublayer, a pinned sublayer, and a protection layer are stacked in this order, forming a multi-layered structure.

The under sublayar used in the multi-layered structures (1) to (9) may be made of any material such as a metal, an oxide, or a nitride; or a mixture of these materials. It may have a stacked structure using these materials. Concretely, the under sublayer may be made of Ta, Hf, Zr, W, Cr, Ti, Mo, Pt, Ni, Ir, Cu, Ag, Co, Zn, Ru, Rh, Re, Au, Os, Pd, Nb, or V; or oxide or nitride of these materials. It may be made of a mixture of at least two ones of these materials. It may be formed by a multi-layered structure using at least two ones of these materials. The under sublayer is not always necessary and it may be canceled.

As an additional element, Ta, Hf, Zr, W, Cr, Ti, Mo, Pt, Ni, Ir, Cu, Ag, Co, Zn, Ru, Rh, Re, Au, Os, Pd, Nb, and/or V may be used.

The free sublayer used in the multi-layered structures (1) to (9) may be made of any material such as NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, or CoZrMoNi. These materials may be amorphous.

The material of the nonmagnetic sublayer used in the multi-layered structures (1) to (9) is different for the case where the MR layer 3 includes the ferromagnetic tunnel junction and the case where the nonmagnetic layer is conductive.

The nonmagnetic sublayer used in the multi-layered structures (1) to (9) may be made of Ti, V, Cr, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Re, and/or V. In addition to the nonmagnetic sublayer using at least one of these materials, any sublayer or sublayers made of Ti, V, Cr, Co, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and/or V may be further stacked.

Each of the first and second MR enhancement layers used in the multi-layered structures (1) to (9) may be made of Co, NiFeCo, FeCo; or CoFeB, CoZrMo, CoZrNb, CoZr, CoZrTa, CoHf, CoTa, CoTaHf, CoNbHf, CoZrNb, CoHfPd, CoTaZrNb, or CoZrMoNi. These materials may be amorphous.

If the first and/or second MR enhancement sublayers are/is not used, the MR ratio is slightly decreased compared with the case where they are used. However, needless to say, the count of the necessary fabrication process steps is decreased.

The pinned sublayer used in the multi-layered structures (1) to (9) maybe made of NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, or CoZrMoNi. These materials maybe amorphous. In addition to the pinned sublayer using at least one of these materials, any sublayer or sublayers made or Ti, V, Cr, Co, Zn, Y, Zr, Nb, Mo, Tc, Ru, Rh; Pd, Ag, Hf, Ta, W, Re, Os, Ir, Pt, Au, Si, Al, Ti, Ta, Pt, Ni, Co, Re, and/or V may be further stacked. A multiplayer structure such as Co/Ru/Co, CoFe/Ru/CoFe, CoFeNi/Ru/CoFeNi, Co/Cr/Co, CoFe/Cr/CoFe, or CoFeNi/Cr/CoFeNi is preferred.

The pinning sublayer used in the multi-layered structures (1) to (9) may be made of FeMn, NiMn, IrMn, RhMn, PtPdMn, ReMn, PtMn, PtCrMn, CrMn, CrAl, or TbCo; or oxide of Ni or Fe; or a mixture of oxide of Ni and oxide of Co; a mixture of oxide of Ni and oxide of Fe; or a two-layer structure of oxide of Ni and oxide of Co, or a two-layer structure of oxide or Ni and oxide of Fe; or CoCr, CoCrPt, CoCrTa, or PtCo. PtMn may be preferably used. Also, PtMn to which Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, and/or Ta is added may be preferably used.

The protection sublayer used in the multi-layered structures (1) to (9) may be made of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, and/or Ni; or a mixture of at least two ones of these materials. The protection sublayer may be cancelled.

Second Embodiment

Figure 4:
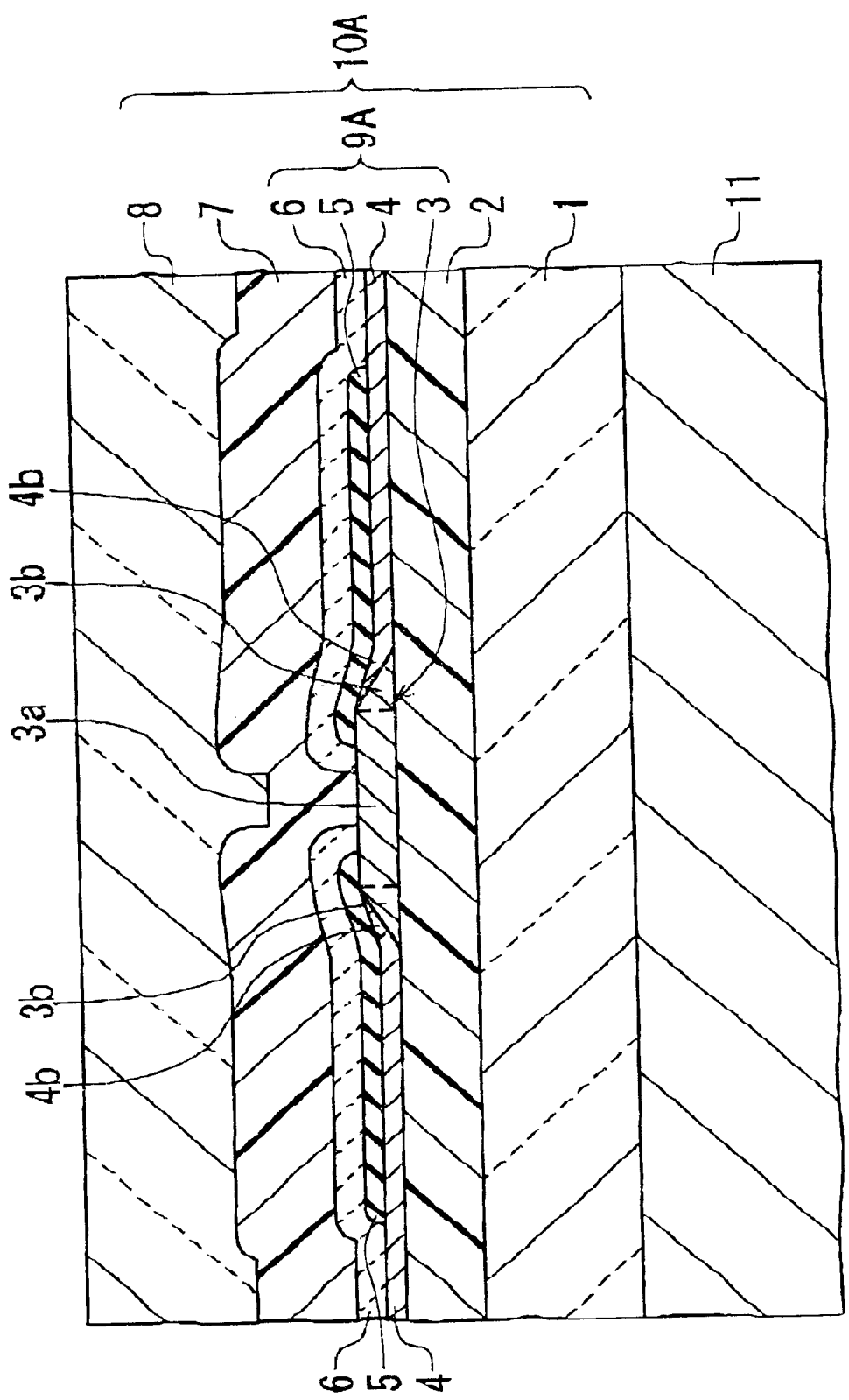
FIG. 4 is a schematic, partial cross-sectional view showing the configuration of the MR head according to a second embodiment or FIG. 2, taking along the line III—III in FIG. 2.

FIG. 4 shows a MR head 10A according to a second embodiment of the present invention.

As seen from FIG. 4, the head 10A has the same configuration as that of the head 10 according to the first embodiment except that regions of the pair of electrode layers 6 are contacted with the pair of underlying vertical biasing layers 4. Therefore, the explanation about the same configuration is omitted here for the sake of simplification of description by attaching the same reference numerals to the same elements in FIG. 4.

The regions of the electrode layers 6 contacted with the vertical biasing layers 4 are sufficiently apart from the MR layer 3. Thus, even if the electrode layers 6 are contacted with the biasing layers 4, the sense current tends to flow through the electrode layers 6 having a lower electrical resistance than the biasing layers 4. This means that the sense current does not flow through the end regions 3b of the MR layer 3. As a result, the same advantages as those in the first embodiment are given.

Third Embodiment

Figure 5:
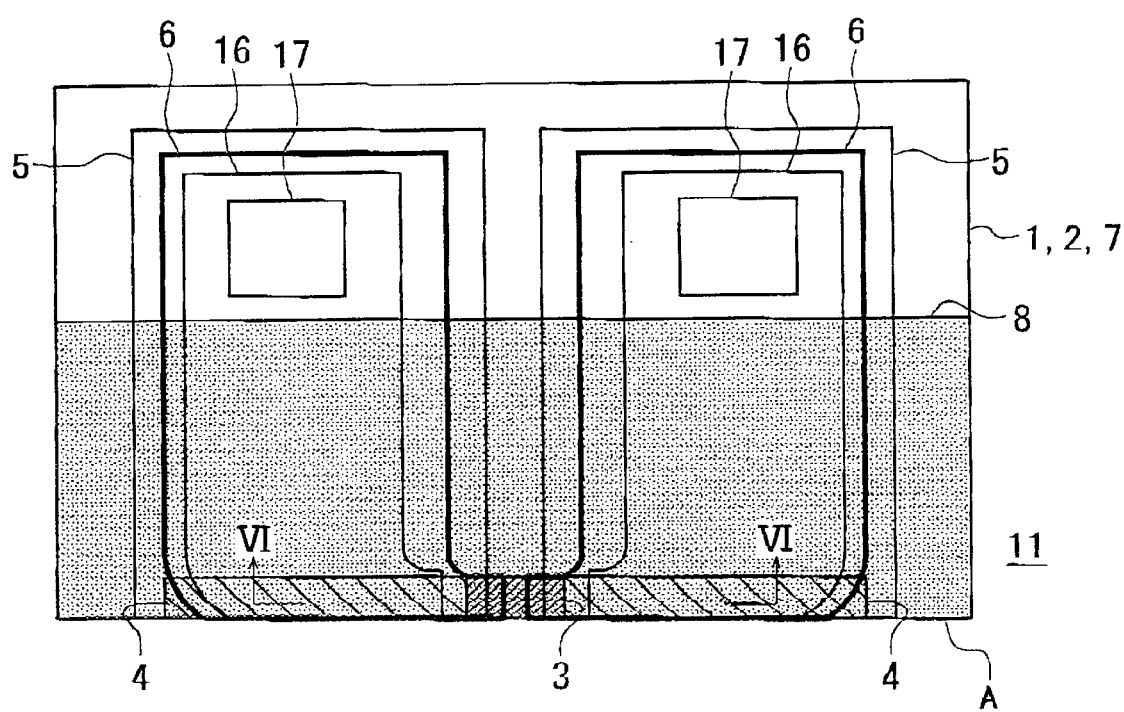
FIG. 5 is a schematic, partial plan view showing the configuration of a MR head according to a third embodiment of the invention.
Figure 6:
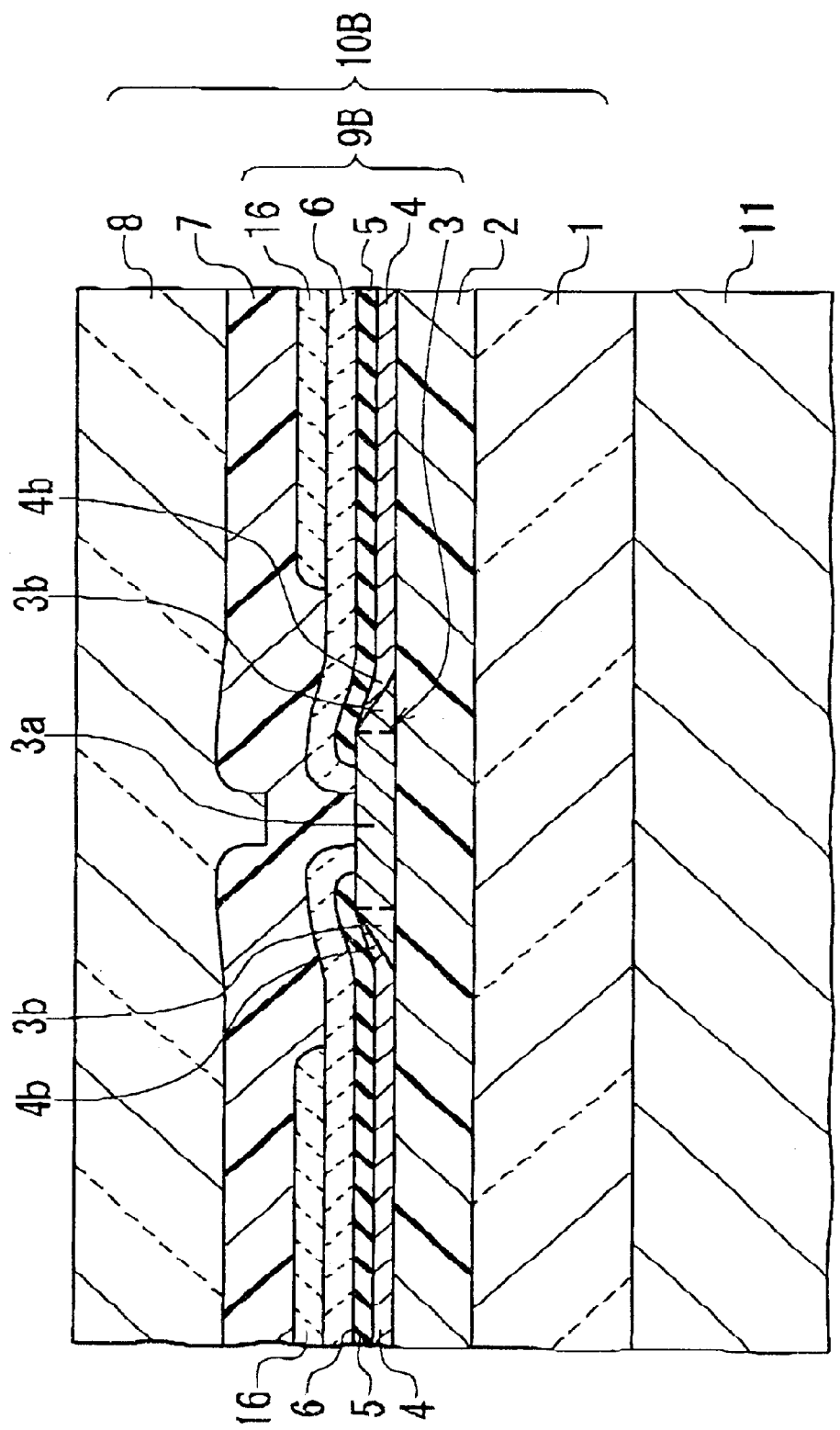
FIG. 6 is a schematic, partial cross-sectional view showing the configuration of the MR head according to the third embodiment of FIG. 5, taking along the line VI—VI in FIG.5.

FIGS. 5 and 6 show a MR head 10B according to a third embodiment of the present invention.

As seen from FIGS. 5 and 6, the head 10B has the same configuration as that of the head 10 according to the first embodiment except that a pair of additional electrode layers 16 are formed at each side of the MR layer 3 between the pair of electrode layers 6 and the upper gap layer 7. Therefore, the explanation about the same configuration is omitted here for the sake of simplification of description by attaching the same reference numerals to the same elements in FIGS. 5 and 6.

With the MR head 10B, each or the pair of additional electrode layers 16 has a plan shape like a L letter, similar to the electrode layers 6. The additional electrode layers 16 are contacted with the electrode layers 6 to be electrically connected to the same. The MR layer 3, the pair of vertical biasing layers 4, the pair of dielectric layers 5, the pair of electrode layers 6, and the additional electrode layers 16 constitute a MR element 9B.

The upper gap layer 7 has two square windows 17 to expose the underlying additional electrode layers 16, as shown in FIG. 5. The upper shielding layer 8 is formed not to cover the windows 17. The electrical connection to the additional electrode layers 16 (and therefore the electrode layers 6) is performed by way of the windows 17.

Next, a fabrication method of the MR head 10B according to the third embodiment is explained below with reference to FIGS. 7A to 7J, in which a writing and reading head assembly is fabricated with the use of the MR head 10B of the third embodiment as its reproduction or reading head.

In FIGS. 7A to 7J, thin lines denote the parts that have been formed in the prior process steps and thick lines denote those are formed in the current process step. Also, for facilitate understanding, all the underlying parts covered by other ones are illustrated by solid lines, not broken lines.

Figure 7A:
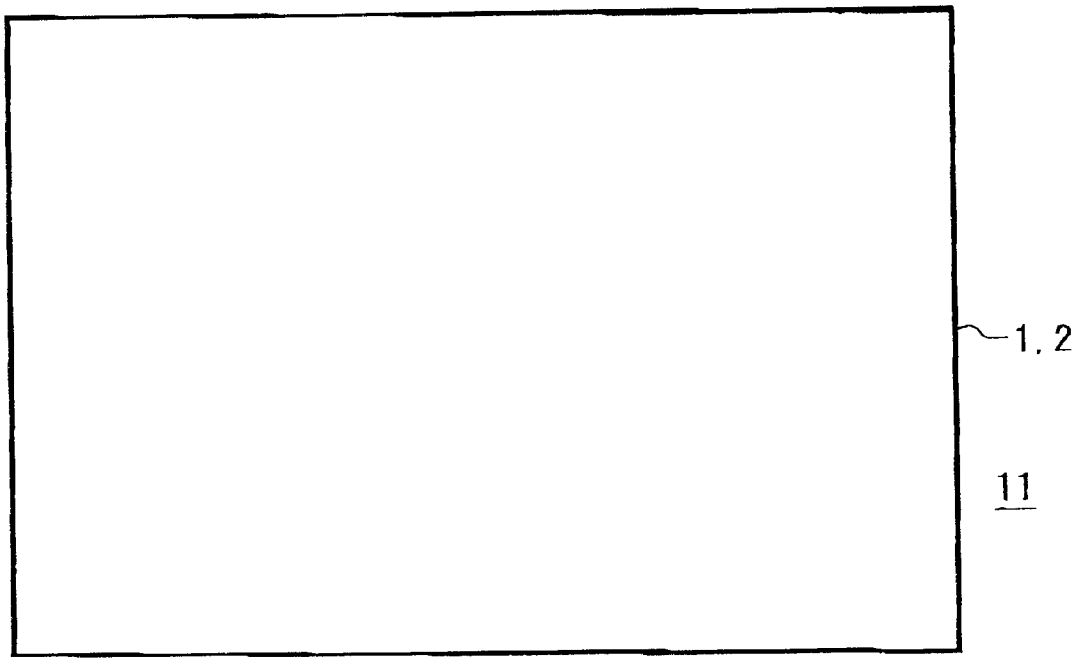

First, the lower shielding layer 1 is formed on the surface of the substrate 11 and then, a patterned photoresist film (not shown) is formed on the layer 1. Using the patterned photoresist film as a mask, the lower shielding layer 1 is patterned to have a specific shape by milling. After the patterned photoresist film is removed by a proper stripping agent, the lower gap layer 2 is formed on the lower shielding layer 1. The state at this stage is shown in FIG. 7A.

Figure 7B:
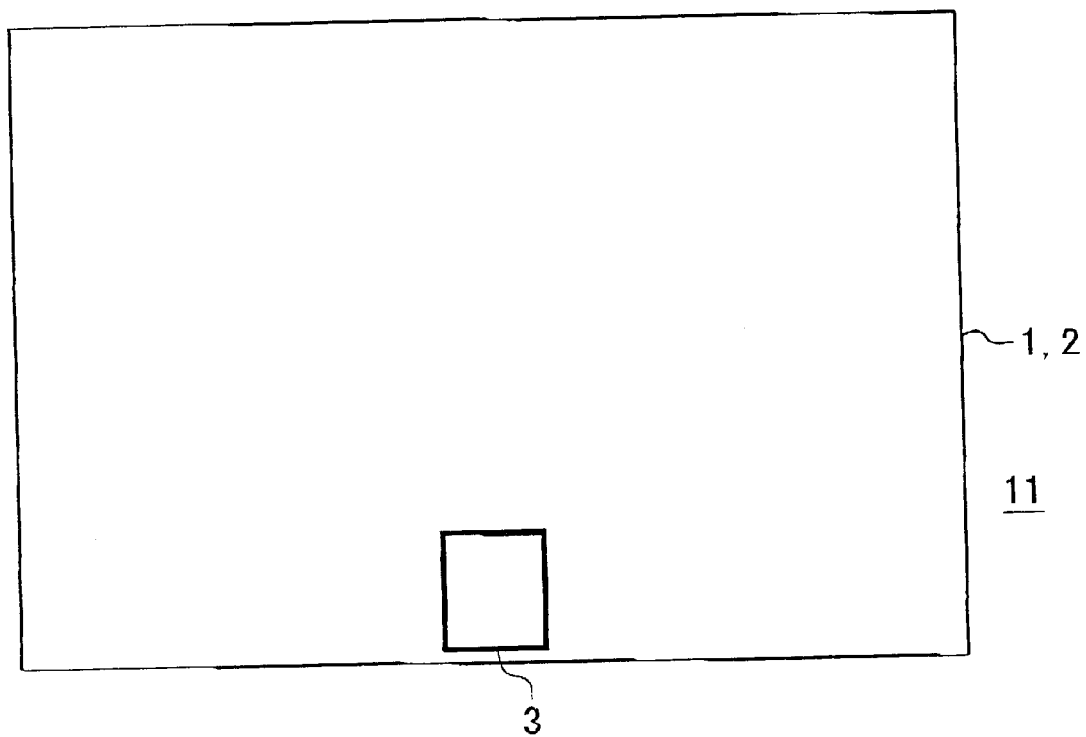

Thereafter, the MR layer 3 is formed on the lower gap layer 2 by a known method and then, the MR layer 3 is patterned to have the specific rectangular plan shape by milling using a patterned photoresist film (not shown) as a mask. The state at this stage is shown in FIG. 7B. The patterned photoresist film is not removed at this stage.

Figure 7C:
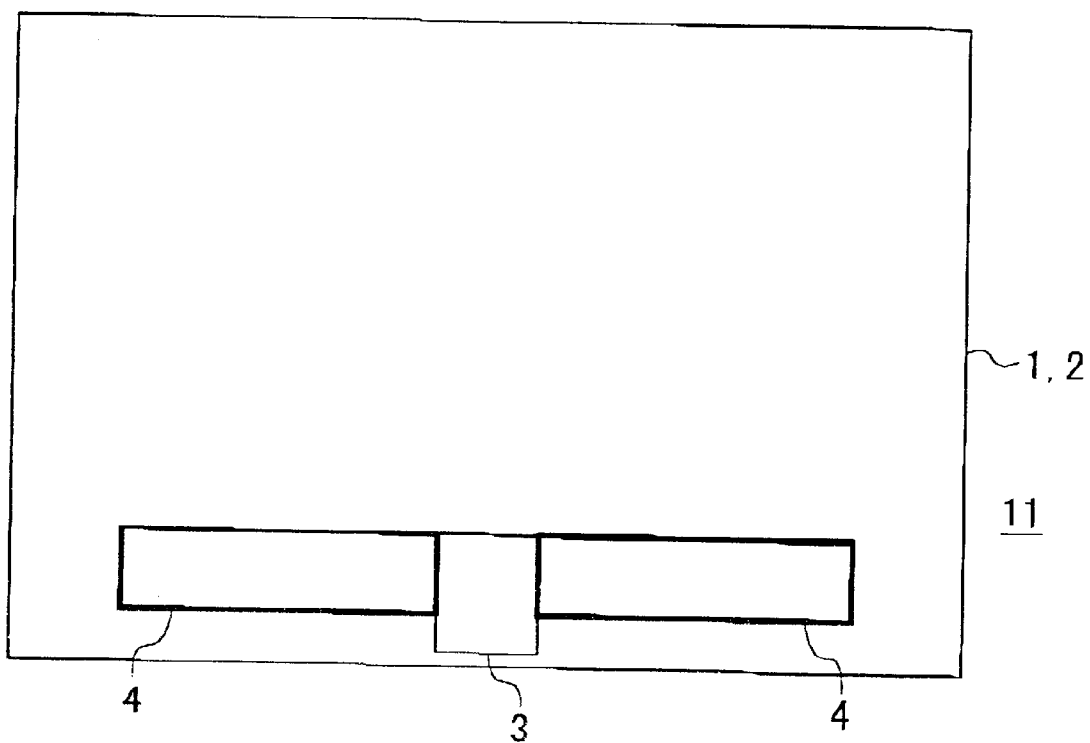

Then, a layer for the vertical biasing layers 4 is formed on the patterned photoresist film and the exposed MR layer 3. The layer thus formed is then selectively removed by a lift off method, i.e., by removing the patterned photoresist film. Thus, the part of the layer located on the MR layer 3 is selectively removed. After a patterned photoresist film (not shown) is formed on the remaining layer, the remaining layer is patterned by milling, thereby forming the pair of vertical biasing layers 4 at each side of the MR layer 3. The state at this stage is shown in FIG. 7C. The patterned photoresist film is removed.

Figure 7D:
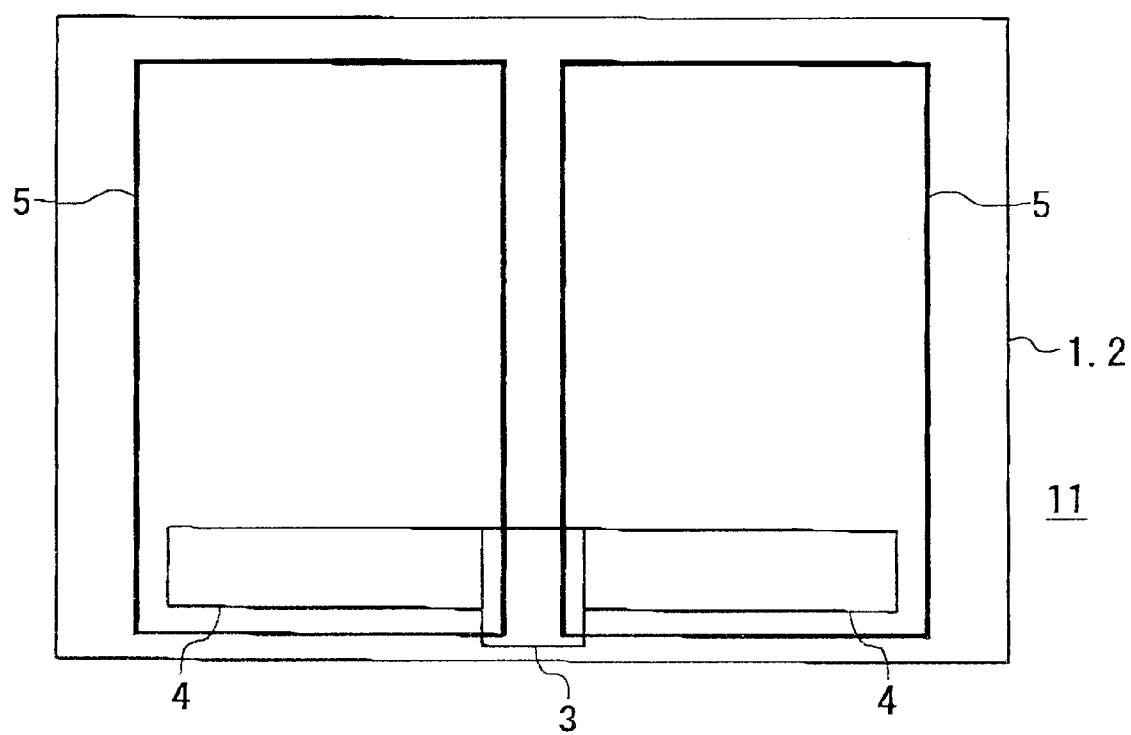

A layer for the pair of dielectric layers 5 is formed to cover the whole substrate 11 and then, a patterned photoresist film (not shown) is formed thereon. The layer is then patterned by milling using the patterned photoresist film as a mask, thereby forming the pair of dielectric layers 5. The state at this stage is shown in FIG. 7D. The patterned photoresist film is removed.

Figure 7E:
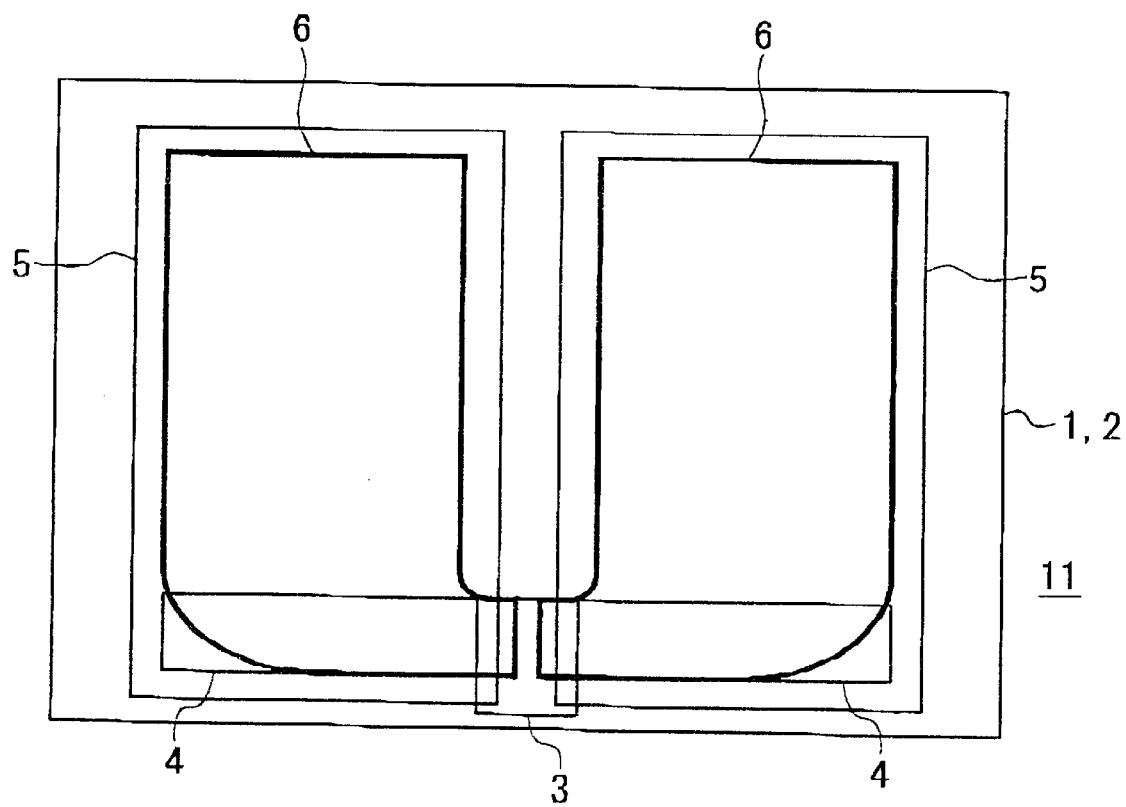

A patterned photoresist film (not shown) is formed to cover the pair of dielectric layers 5. Then, a layer for the pair of electrode layers 6 is formed over the whole substrate 11. The layer is patterned by a lift off method, i.e., removing the patterned photoresist film, forming the pair of electrode layers 6 at each side of the MR layer 3. The state at this stage is shown in FIG. 7E.

Figure 7F:
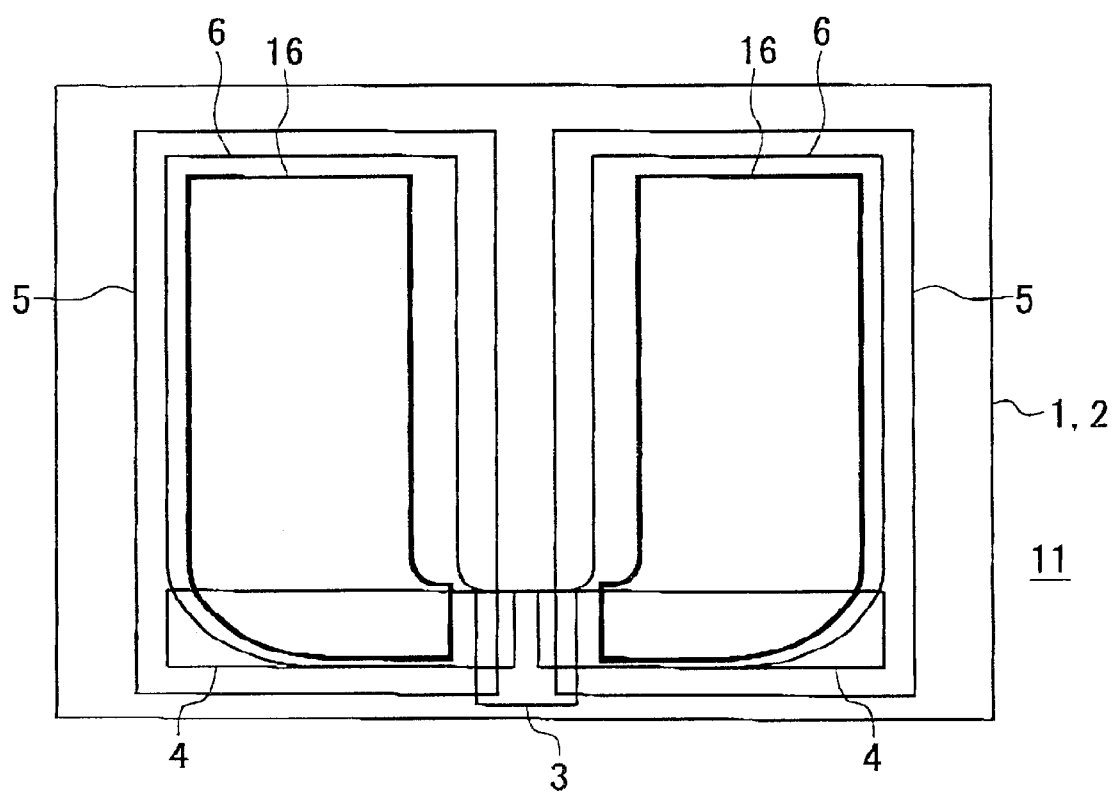

Following this, a patterned photoresist film (not shown) is formed to cover the electrode layers 6 and then, a layer for the pair of additional electrode layers 16 is formed. The layer is patterned by a lift off method, i.e., removing the patterned photoresist film, forming the pair of additional electrode layers 16 on the pair of electrode layers 6 at each side of the MR layer 3. The state at this stage is shown in FIG. 7F.

Figure 7G:
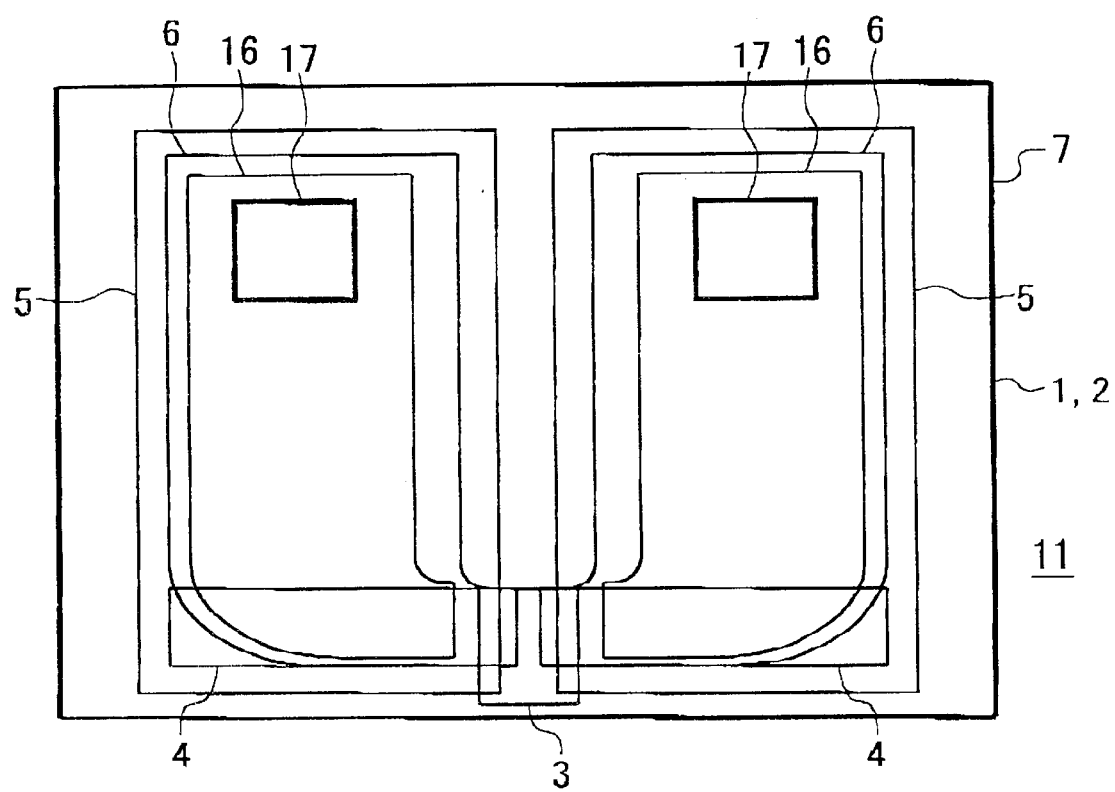

The upper gap layer 7 is formed to cover the pair or additional electrode layers 16 and the pair of electrode layers 6 and then, a patterned photoresist film (not shown) with specific windows is formed thereon. The parts of the upper gap layer 7 exposed from the windows of the photoresist film are selectively removed by milling, thereby forming the square windows 17 to penetrate the layer 7. The state at this stage is shown in FIG. 7G. The patterned photoresist film is removed.

Figure 7H:
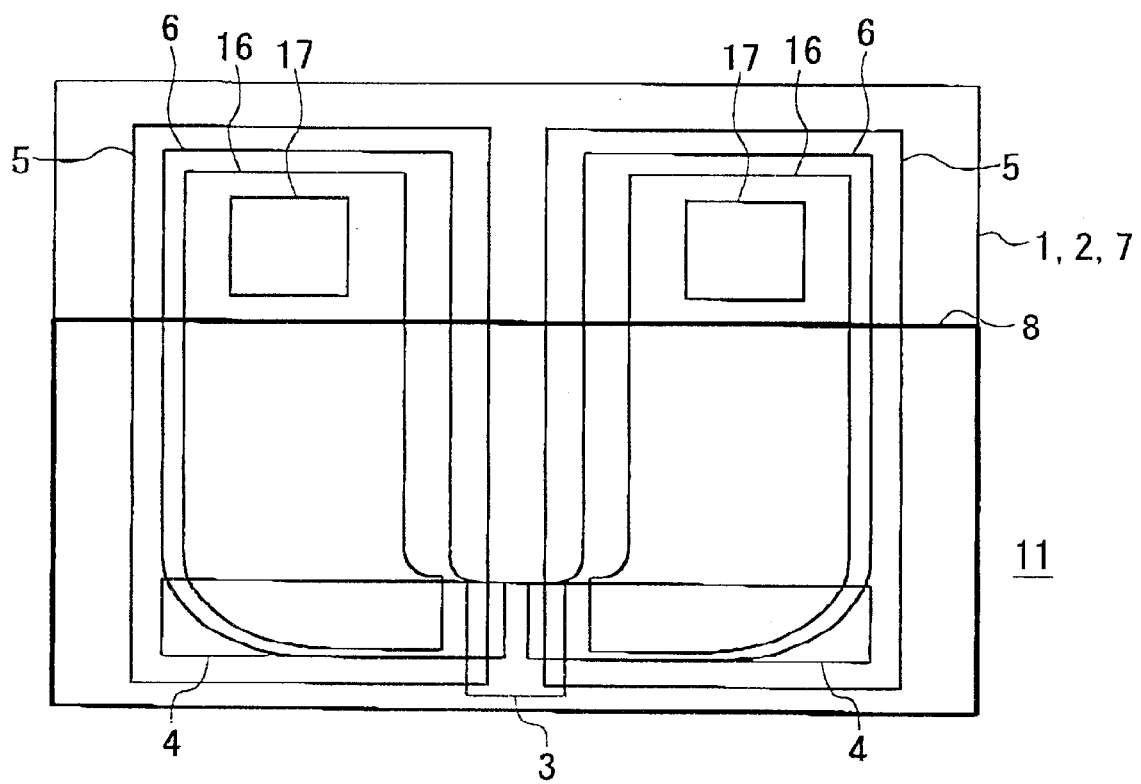
Figure 71:
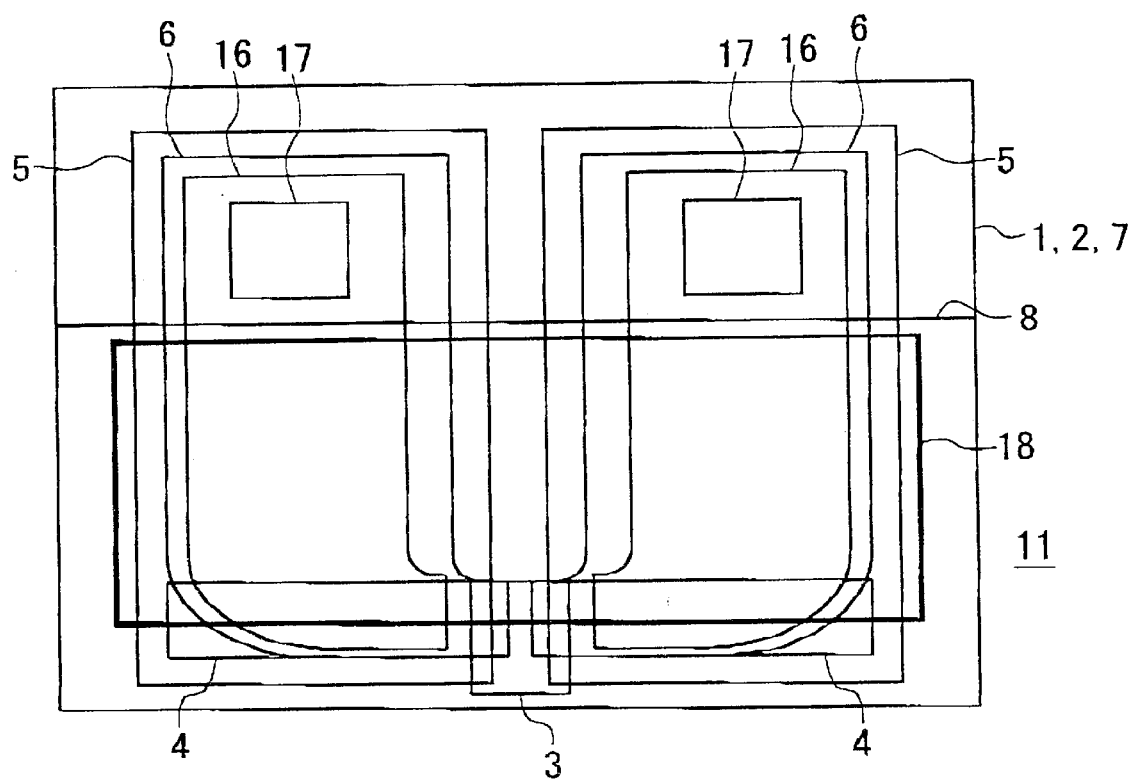

The upper shielding layer 8 is formed over the whole substrate 11 and then, patterned by a known method, as shown in FIG. 7H. Typically, a patterned frame resist film (not shown) is formed on pair of additional electrode layers 16 and the pair of electrode layers 6 and then, a layer for the upper shielding layer 8 is formed thereon. Then, the frame resist film is removed to pattern the overlying layer, thereby forming the upper shielding layer 8. The state at this stage is shown in FIG. 7H.

Subsequently, a writing or recording head 18 is formed on the upper shielding layer 8, as shown in FIG. 7I. Since the recording head 18 may have any type or structure, no further detailed explanation is presented here.

Figure 7J:
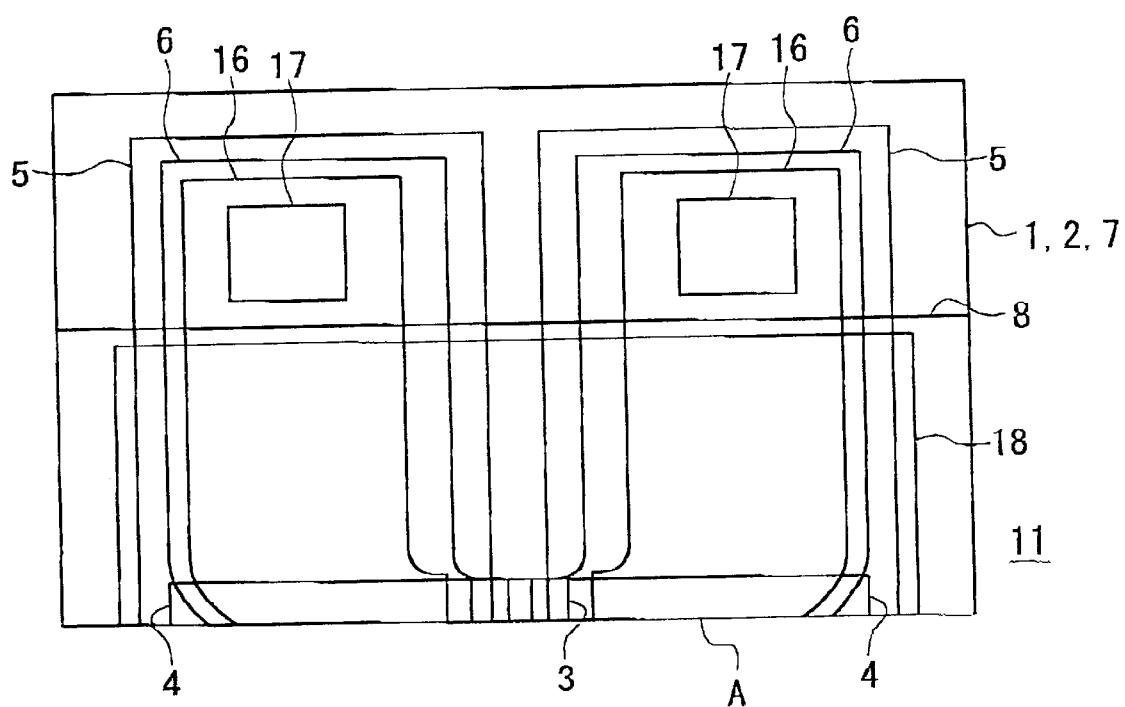

Finally, the end surface of the layered structure shown in FIG. 7I is subjected to a lapping process to be parallel to the ABS A, thereby removing the unnecessary parts and adjusting the height of the MR element 9. The state at this stage is shown in FIG. 7J.

Through the above-described process steps, the recording and reproducing head assembly including the MR head 10B is completed.

Fourth Embodiment

FIG. 8 shows a MR sensing system 23 according to a fourth embodiment of the present invention.

As seen from FIG. 8, the system 23 includes the MR head 10 according to the first embodiment shown in FIGS. 2 and 3 provided on the substrate 11. Therefore, the explanation about the head 10 is omitted here by attaching the same reference numerals to the same elements in FIG. 8.

The MR sensing system 23 comprises the MR head 10, a current source 21, and a sensing circuit 22. Each of the current source 21 and the sensing circuit 22 is electrically connected across the pair of electrode layers 6. Thus, the current source 21 and the sensing circuit 22 are electrically connected in parallel across the pair of electrode layers 6. The MR element 9 is supplied with a sense current 20. As shown by the arrow in FIG. 8, the sense current 20 flows from the left-hand side positive electrode layer 6 to the right-hand side negative electrode layer 6 by way of the inner region 3a of the MR layer 3. The value of the current 20 is set to have a specific value.

The sensing circuit 22 senses the voltage generated between the pair of electrode layers 6. The electrical resistance of the MR layer 3 varies according to the orientation of the magnetic field applied to the layer 3 and therefore, the electrical resistance change of the layer 3 appears as the change of the voltage between the pair of electrode layers 6 if the sense current 20 is kept constant. Thus, the electrical resistance change of the MR layer 3 can be sensed by way of the detection of the voltage change generated between the pair of electrode layers 6, thereby sensing the orientation and magnitude of the magnetic field applied to the MR layer 3. The sensing circuit 22 senses the electrical resistance change of the MR layer 3 as a function of the magnetic field to be sensed.

Fifth Embodiment

Figure 9:
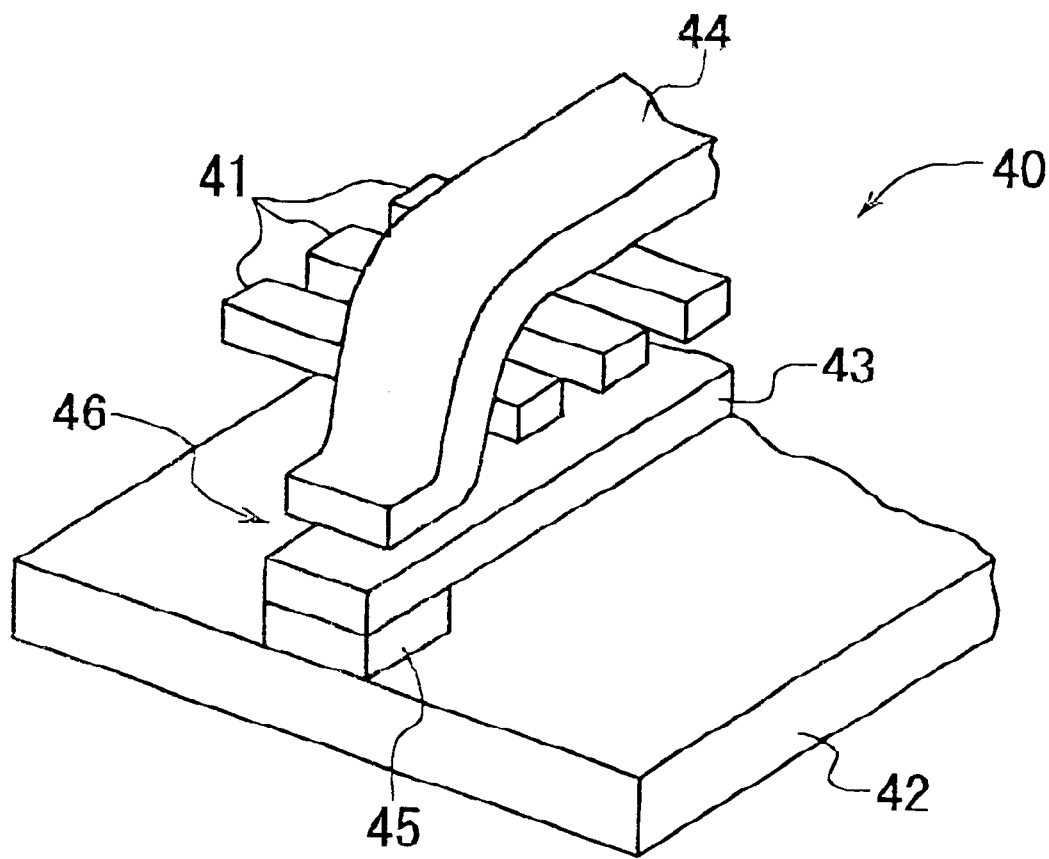
FIG. 9 is a schematic, partial perspective view showing the configuration of a magnetic recording and reproducing head according to a fifth embodiment of the invention.

FIG. 9 shows a recording and reproducing head assembly 40 according to a fifth embodiment of the present invention, which comprises a substrate 42, a reproducing head 45 formed on the substrate 42, and a recording head 46 formed over the substrate 42 to be combined with the head 45. The recording head 46 includes a lower magnetic pole 43, an upper magnetic pole 44, and a coil 41 located between the lower and upper poles 43 and 44.

The reproducing head 45 is formed by the MR head 10, 10A, or 10B according to the first, second, or third embodiment of the invention. Preferably, as the substrate 42, the substrate 11 used for the MR heads 10, 10A, and 10B according to the first to third embodiments is used. Alternately, the substrate 42 may be formed separately from the substrate 11.

The lower magnetic pole 43 may be formed by the upper shielding layer 8, in other words, the upper shielding layer 8 may be commonly used for the lower magnetic pole 43. In this case, the upper shielding layer 8 has the same function as the magnetic pole 43 and therefore, the structure of the head assembly 40 can be simplified. Needless to say, thee lower magnetic pole 43 may be formed separately from the upper shielding layer 8.

The head assembly 40 has a writing function to write or record pieces of information into a proper magnetic recording medium and a reading function to reproduce or read out the pieces of information stored in the medium.

It is preferred that the sensing region (i.e., the MR element 9) of the MR head 10B serving as the reproducing head is arranged to entirely overlap with the magnetic gap of the head assembly 40. In this case, there is an additional advantage that the recording and reproducing heads 46 and 45 can be simultaneously positioned with respect to the same track of the medium.

Sixth Embodiment

Figure 10:
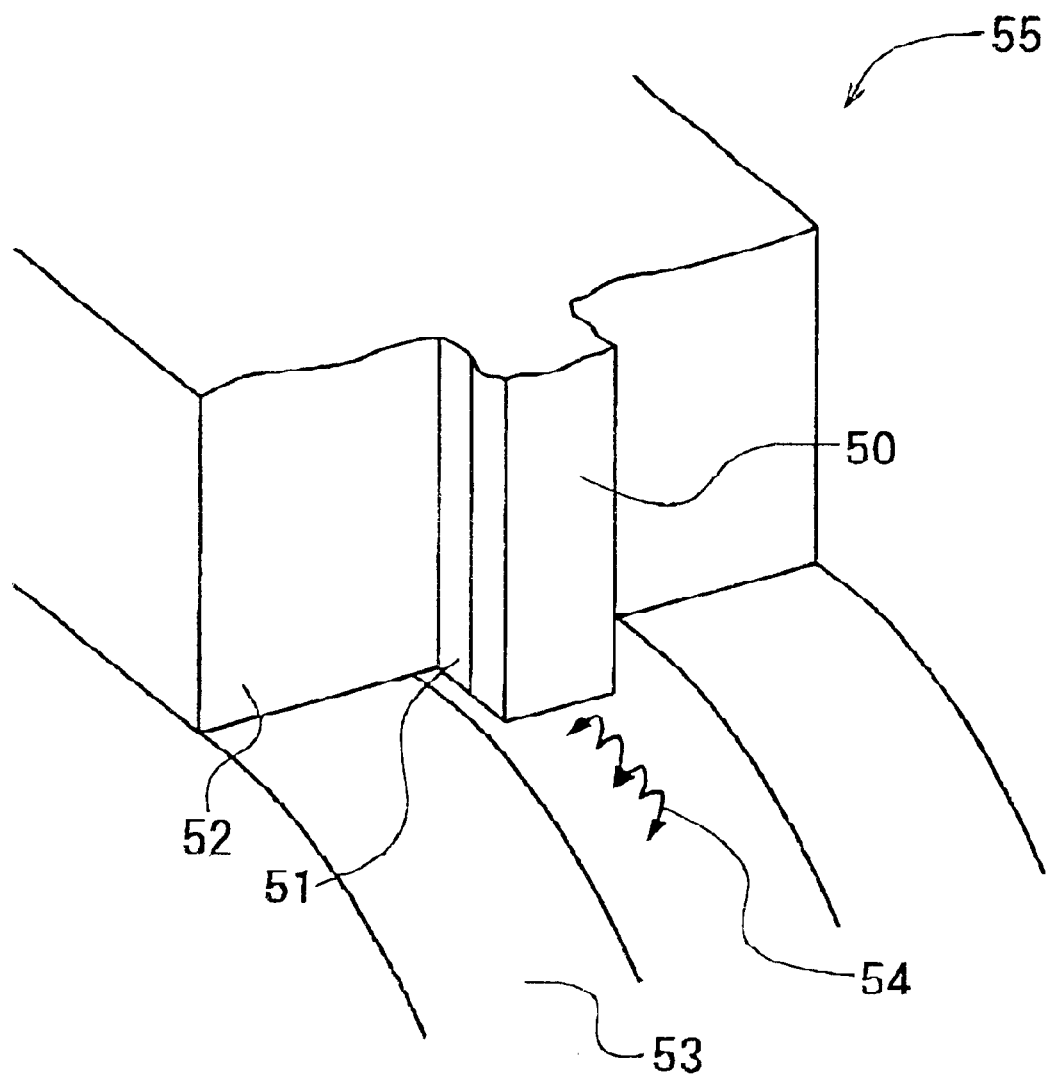
FIG. 10 is a schematic, partial perspective view showing the configuration of a magnetic storing (i.e., recording and reproducing) system according to a sixth embodiment or the invention.

FIG. 10 shows a magnetic recording and reproducing system 55 according to a sixth embodiment of the present invention. As seen from FIG. 10, the system 55 includes a substrate 52 serving as a head slider, a reproducing head 51 formed on the substrate 52, and a recording head 50 formed to be combined with the head 51.

As the combination of the reproducing and recording heads 51 and 52, the recording and reproducing head assembly 40 according to the fifth embodiment shown in FIG. 9 is preferably used.

As shown in FIG. 10, the reproducing and recording heads 50 and 51 are provided on the substrate 52 to thereby constitute a magnetic recording and reproducing head assembly. The head assembly can be moved and positioned to desired locations over a magnetic recording medium 53 rotating around a specific axis such as a hard disk by a proper actuator (not shown). The substrate 52 is relatively moved With respect to the medium 53 along its surface while the substrate 52 is contacted with the medium 53 or apart from the medium 53 at a small gap such as 0.2 $\mu$m or less. Through this configuration and mechanism, the reproducing head 51 is located at proper positions where the head 51 can reproduce the magnetic signal (i.e., the pieces of information recorded in the medium 53) by way of the leakage magnetic flux 54 from the medium 53.

Tests

To examine the advantages of the present invention, the inventor actually produced the recording and reproducing head assembly 40 according to the fifth embodiment shown in FIG. 9 and then, carried out some tests in the following way.

In the recording and reproducing head assembly 40, the MR head 10B according to the third embodiment of FIGS. 5 and 6 was used as the reproducing head 45.

The substrate 42 was formed by an altic member on which a alumina layer (10 $\mu$m thick) was formed.

The reproducing head 45, i.e., the MR head 10B according to the third embodiment was produced by the following members.

The MR layer 5 had a multilayer structure comprising a Zr sublayer (3 nm thick), a $Pt_{46}Mn_{54}$ sublayer (15 nm thick), a $Co_{90}Fe_{10}$ sublayer (2 nm thick), a Ru sublayer (0.8 nm thick), a $Co_{90}Fe_{10}$ sublayer (2 nm thick), a Cu sublayer (2 nm thick), a $Co_{90}Fe_{10}$ sublayer (0.5 nm thick), a $Ni_{82}Fe_{18}$ sublayer (4 nm thick), and a Ta sublayer (3 nm thick). These sublayers were successively formed under application of desired magnetic field.

In the above-described alloys such as $Pt_{46}Mn_{54}$, the composition ratio of the individual component elements is denoted by the atomic % (i.e., at %), which is applied to the explanation shown below.

After forming the above-described multilayer structure, a heat treatment was performed for the same structure at 250°

C. for 5 hours with applying a magnetic field of 8 kOe thereto. All the sublayers forming the MR layer 5 were patterned to have the desired rectangular shape using a popular milling apparatus in a pure argon (Ar) atmosphere of 0.3 Pa. The milling operation was conducted in a perpendicular direction to the layer 5.

The lower shielding layer 1 was formed by a $Co_{89}Zr_4Ta_4Cr_3$ layer with a thickness of 1 μm.

The lower gap layer 2 was formed by an alumina layer with a thickness of 20 nm.

The pair of electrode layers 6 had a multilayer structure comprising a Ta sublayer (1.5 nm thick), an Au sublayer (40 nm thick), and a Ta sublayer (3 nm thick).

The pair of additional electrode layers 16 had a multilayer structure comprising a Ta sublayer (15 nm thick), an Au sublayer (240 nm thick), and a Ta sublayer (3 nm thick).

The pair of dielectric layers 5 were made of alumina (20 nm thick).

The pair of vertical biasing layers 4 had a multilayer structure comprising a Cr sublayer (10 nm thick) and a $Co_{74.5}Cr_{10.5}Pt_{15}$ sublayer (24 nm thick).

The upper gap layer 7 was made of alumina (40 nm thick).

The upper shielding layer 9 was formed by the lower magnetic pole 43 of the recording head 46. In other words, the lower magnetic pole 43 was used as the upper shielding layer 8.

The recording head 46 was produced by the following members.

The ground layer (not shown) for the lower magnetic pole 43 was made of $Ni_{82}Fe_{18}$ (90 nm thick).

The lower magnetic pole 43 had a multilayer structure comprising a $Ni_{82}Fe_{18}$ sublayer (2.5 μm thick) and a $Co_{65}Ni_{12}Fe_{23}$ sublayer (0.5 μm thick).

The recording gap layer (not shown) was made of alumina (0.3 μm thick).

The additional recording gap layer (not shown) was made of alumina (0.7 μm thick).

The ground layer (not shown) for the coil 41 had a multilayer structure comprising a Cr sublayer (30 nm in thick) and a Cu sublayer (150 nm in thick).

The coil 41 was made of Cu (4.5 μm thick).

The ground layer (not shown) for the upper magnetic pole 44 had a multilayer structure comprising a Ti sublayer (10 nm thick) and a $Co_{65}Ni_{12}Fe_{23}$ sublayer (0.1 μm thick).

The upper magnetic pole 44 had a multilayer structure comprising a $Co_{65}Ni_{12}Fe_{23}$ sublayer (0.5 μm thick) and a $Ni_{82}Fe_{18}$ sublayer (3.5 μm thick).

The ground layer (not shown) for the terminals (not shown) had a multilayer structure comprising a Cr sublayer (30 nm thick) and a Cu sublayer (150 nm thick).

The terminals were made of Cu (50 μm thick).

The overcoat layer (not shown) was made of alumina (52 μm thick).

The ground layer (not shown) for the gold terminals (not shown) had a multilayer structure comprising a Ti sublayer (10 nm thick) and a $Ni_{82}Fe_{18}$ sublayer (0.1 μm thick).

The gold terminals were made of Au (3 μm thick).

The reproducing head 45 was fabricated through the following process steps.

Substrate Cleaning→Lower shielding layer formation and annealing→Alignment mark formation→Lower shielding layer patterning→Lower gap layer formation→MR element formation→Vertical biasing layer formation→Dielectric layer formation→Electrode layer formation→Additional electrode layer formation →Pole height monitor formation→Additional electrode formation →Upper gap layer formation.

The recording head 46 was fabricated through the following process steps.

Lower magnetic pole formation→Recording gap layer formation→Connection pole formation→Coil formation→Upper magnetic pole formation→Terminal formation→Overcoat layer formation→Gold terminal formation.

Thereafter, the substrate 42 was divided into pieces to separate the individual recording and reproducing head assemblies 40 from each other. The ABS A of each assembly 40 was lapped and then, a DLC layer was formed on the ABS A of each assembly 40. The substrate 42 of each assembly 40 was processed to form a slider structure. Then, each assembly 40 was mounted on a suspension.

For comparison, the prior-art recording and reproducing head assembly was fabricated through the same process steps as explained above except that the processes of forming the dielectric layers 5 and of forming the additional electrode layers 16 were omitted.

Using the recording and reproducing head assembly 40 according to the fifth embodiment of the invention and the prior-art recording and reproducing head assembly, specific data was recorded in a CoCrTa-system magnetic recording medium. The recording medium had a coercive force of 5.0 kOe and a MrT of 0.35 memu/cm². In this writing process, the writing track width (i.e., the width of the upper pole 44) was set at 0.7 μm, the writing gap was set at 0.12 μm, and the reading track width was 0.5 μm. The reading track width of 0.5 μm was a designed value.

Subsequently, the reproduction output, the wiggle, and the effective reading or reproduction track width wore measured. The measurement result obtained by the examination is shown in the following Table 1.

TABLE 1

|  | Reproduction Output (mV) | Wiggle (%) | Effective Reproduction Track Width (μm) |
|---|---|---|---|
| Prior Art | 3.3 | 1.2 | 0.8 |
| Embodiment | 3.1 | 1.0 | 0.5 |

As seen from Table 1, although the prior-art assembly is slightly higher in the reproduction output than that of the fifth embodiment of the invention, the former is approximately equal in the wiggle to the latter. What is the most important is in the effective reproduction track width. Specifically, in the prior-art assembly, the effective reproduction track width is wider than the designed value of 0.5 μm. On the other hand, in the assembly of the fifth embodiment of the invention, the effective reproduction track width is equal to the designed value of 0.5 μm.

The fact that the effective reproduction track width is equal to the designed value means that the effective reproduction track width can be narrowed, in other words, the assembly of the invention can cope with further narrowing of the effective reproduction track width, compared with the prior-art assembly. In the above-described two assemblies examined, it is seen that the assembly of the invention realizes 1.6 times as high a recording density as the prior-art assembly. It is supposed that this advantage is due to the fact that the sense current 20 flows through only the middle part of the inner region 3a of the MR layer 3 where the orientation of magnetization is easily changed by the applied external magnetic field while it bypasses the end regions 3b of the layer 3 where the orientation of magnetization is fixed by the vertical biasing magnetic field or difficultly changed by the applied external magnetic field.

Next, a configuration of the magnetic disk apparatus using the MR head assembly according to the invention is explained below.

This magnetic disk apparatus comprises a bass, three magnetic recording disks, signal processing circuitry, and an input/output interface. The signal processing circuitry and the input/output interface are incorporated into the base. The apparatus is electrically connected to any system located outside the apparatus by way of a 32-bit bus. Six magnetic recording heads are provided for the six surfaces of the three disks. The apparatus further comprises a rotary actuator for driving the heads, control circuitry for controlling the operation of the apparatus, and a motor for rotating the disks.

The disks are 46 mm in diameter. On each data surface of the disks, the area having a diameter from 10 mm to 40 mm is used for data recording. The embedded servo system is used and therefore the recording density can be made high because no servo surface is required.

The magnetic disk apparatus is capable of direct connection to a small-sized computer as an external data storage subsystem. The input/output interface includes cache memories, which copes with the bus lines having a transmission speed of 5 to 20 mega bites/sec. If the magnetic disk apparatuses are coupled together and designed to be controlled by an external controller, a large capacity magnetic disk system can be configured.

In the above-explained MR heads according to the first to third embodiments of the invention, each of the pair of vertical biasing layers 4 has an approximately rectangular plan shape. However, the invention is not limited to this shape. Each of the pair of vertical biasing layers 4 may have any other plan shape.

Also, at least one grounding layer may be additionally formed under each of the lower shielding layer 1, the lower gap layer 2, the MR layer 3, the vertical biasing layers 4, the dielectric layers 5, the electrode layers 6, the upper gap layer 7, and the upper shielding layer 8, as necessary. Similarly, at least one overlying or protection layer may be additionally formed on or over each of the lower shielding layer 1, the lower gap layer 2, the MR layer 3, the vertical biasing layers 4, the dielectric layers 5, the electrode layers 6, the upper gap layer 7, and the upper shielding layer 8, as necessary.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A magnetoresistance element comprising:
(a) a MR layer having a width corresponding to a recording track width of an applicable magnetic recording medium;
(b) a pair of vertical biasing layers disposed at each side of said MR layer to be overlapped with each end of said MR layer;
   inner opposing ends of said pair of vertical biasing layers being contacted with said MR layer;
(c) a pair of dielectric layers formed on said pair of biasing layers;
   inner opposing ends of said dielectric layers being contacted with said MR layer; and
(d) a pair of electrode layers formed on said pair of dielectric layers;
   inner opposing ends of said pair of electrode layers being contacted with said MR layer, thereby electrically connecting said pair of electrode layers to said MR layer;
   a distance between said inner opposing ends of said pair of electrode layers being smaller than a width of said MR layer, wherein each of said inner opposing ends of said pair of dielectric layers is located between one of said innermost ends of said pair of electrode layers and a corresponding one of said innermost ends of said pair of vertical biasing layers.

2. A magnetoresistance element comprising:
(a) a MR layer;
(b) a pair of vertical biasing layers disposed at each side of said MR layer to be overlapped with each end of said MR layer;
   inner opposing ends of said pair of vertical biasing layers being contacted with said MR layer;
(c) a pair of electrode layers formed on said pair of biasing layers;
   innermost ends of said pair of electrode layers being located more inwardly than innermost ends of said pair of vertical biasing layers;
   said pair of electrode layers being electrically connected to said MR layer; and
(d) a pair of dielectric layers formed to overlap with said pair of biasing layers and said MR layer;
   each of innermost ends of said pair of dielectric layers being located between one of said innermost ends of said pair of electrode layers and a corresponding one of said innermost ends of said pair of vertical biasing layers.

3. A magnetoresistance head comprising:
(a) a lower shielding layer formed on a substrate;
(b) a lower dielectric gap layer formed on said lower shielding layer;
(c) a MR element formed on said lower dielectric gap layer, said MR element including:
   (i) a MR layer having a width corresponding to a recording track width of an applicable magnetic recording medium;
   (ii) a pair of vertical biasing layers disposed at each side of said MR layer to be overlapped with each end of said MR layer;
      inner opposing ends of said pair of vertical biasing layers being contacted with said MR layer;
   (iii) a pair of dielectric layers formed on said pair of biasing layers;
      inner opposing ends of said dielectric layers being contacted with said MR layer; and
   (iv) a pair of electrode layers formed on said pair of dielectric layers, inner opposing ends of said pair of electrode layers being contacted with said MR layer, thereby electrically connecting said pair of electrode layers to said MR layer;
      a distance between said inner opposing ends of said pair of electrode layers being smaller than a width of said MR layer; and
      wherein each of said inner opposing ends of said pair of dielectric layers being located between one of said innermost ends of said pair of electrode layers and a corresponding one of said innermost ends of said pair of vertical biasing layers;
(d) an upper dielectric gap layer formed on said MR element; and
(e) an upper shielding layer formed on said upper dielectric gap layer.

4. A magnetoresistance head comprising:
(a) a lower shielding layer formed on a substrate;

(b) a lower dielectric gap layer formed on said lower shielding layer;
(c) a MR element formed on said lower dielectric gap layer, said MR element including:
   (i) a MR layer;
   (ii) a pair of vertical biasing layers disposed at each side of said MR layer to be overlapped with each end of said MR layer;
      inner opposing ends of said pair of vertical biasing layers being contacted with said MR layer;
   (iii) a pair of electrode layers formed on said pair of biasing layers;
      innermost ends of said pair of electrode layers being located more inwardly than innermost ends of said pair of vertical biasing layers;
      said pair of electrode layers being electrically connected to said MR layer; and
   (iv) a pair of dielectric layers formed to overlap with said pair of biasing layers and said MR layer;
      each of innermost ends of said pair of dielectric layers being located between one of said innermost ends of said pair of electrode layers and a corresponding one of said innermost ends of said pair of vertical biasing layers;
(d) an upper dielectric gap layer formed on said MR element; and
(e) an upper shielding layer formed on said upper dielectric gap layer.

5. A magnetoresistance sensing system comprising:
(a) a MR element, said element including:
   (i) a MR layer having a width corresponding to a recording track width of an applicable magnetic recording medium;
   (ii) a pair of vertical biasing layers disposed at each side of said MR layer to be overlapped with each end of said MR layer;
      inner opposing ends of said pair of vertical biasing layers being contacted with said MR layer;
   (iii) a pair of dielectric layers formed on said pair of biasing layers;
      inner opposing ends of said dielectric layers being contacted with said MR layer; and
   (iv) a pair of electrode layers formed on said pair of dielectric layers;
      inner opposing ends of said pair of electrode layers being contacted with said MR layer, thereby electrically connecting said pair of electrode layers to said MR layer;
      a distance between said inner opposing ends of said pair of electrode layers being smaller than a width of said MR layer; and
      wherein each of said inner opposing ends of said pair of dielectric layers being located between one of said innermost ends of said pair of electrode layers and a corresponding one of said innermost ends of said pair of vertical biasing layers;
(b) means for generating a current flowing through said element; and
(c) means for sensing an electrical resistance change of said element as a function of a magnetic field to be sensed by said element.

6. A magnetoresistance sensing system comprising:
(a) a MR element, said element including:
   (i) a MR layer;
   (ii) a pair of vertical biasing layers disposed at each side of said MR layer to be overlapped with each end of said MR layer;
      inner opposing ends of said pair of vertical biasing layers being contacted with said MR layer;
   (iii) a pair of electrode layers formed on said pair of biasing layers;
      innermost ends of said pair of electrode layers being located more inwardly than innermost ends of said pair of vertical biasing layers;
      said pair of electrode layers being electrically connected to said MR layer; and
   (iv) a pair of dielectric layers formed to overlap with said pair of biasing layers and said MR layer;
      each of innermost ends of said pair of dielectric layers being located between one of said innermost ends of said pair of electrode layers and a corresponding one of said innermost ends of said pair of vertical biasing layers;
(b) means for generating a current flowing through said element; and
(c) means for sensing an electrical resistance change of said element as a function of a magnetic field to be sensed by said element.

7. A magnetoresistance sensing system comprising:
(a) a MR head, said MR head including:
   (i) a lower shielding layer formed on a substrate;
   (ii) a lower dielectric gap layer formed on said lower shielding layer;
   (iii) a MR element formed on said lower dielectric gap layer, said MR element including:
      (A) a MR layer having a width corresponding to a recording track width of an applicable magnetic recording medium;
      (B) a pair of vertical biasing layers disposed at each side of said MR layer to be overlapped with each end of said MR layer;
         inner opposing ends of said pair of vertical biasing layers being contacted with said MR layer;
      (C) a pair of dielectric layers formed on said pair of biasing layers;
         inner opposing ends of said dielectric layers being contacted with said MR layer; and
      (D) a pair of electrode layers formed on said pair of dielectric layers;
         inner opposing ends of said pair of electrode layers being contacted with said MR layer, thereby electrically connecting said pair of electrode layers to said MR layer;
         a distance between said inner opposing ends of said pair of electrode layers being smaller than a width of said MR layer; and
         wherein each of said inner opposing ends of said pair of dielectric layers being located between one of said innermost ends of said pair of electrode layers and a corresponding one of said innermost ends of said pair of vertical biasing layers;
   (iv) an upper dielectric gap layer formed on said MR element; and
   (v) an upper shielding layer formed on said upper dielectric gap layer;
(b) means for generating a current flowing through said element; and
(c) means for sensing an electrical resistance change of said element as a function of a magnetic field to be sensed by said element.

8. A magnetic storing system comprising:
(a) a magnetic recording subsystem for recording information in a magnetic recording medium having information-recording tracks;

(b) a MR sensing system, said MR sensing system including:
  (i) a MR element, said element including:
    (A) a MR layer having a width corresponding to a recording track width of an applicable magnetic recording medium;
    (B) a pair of vertical biasing layers disposed at each side of said MR layer to be overlapped with each end of said MR layer;
      inner opposing ends of said pair of vertical biasing layers being contacted with said MR layer;
    (C) a pair of dielectric layers formed on said pair of biasing layers;
      inner opposing ends of said dielectric layers being contacted with said MR layer; and
    (D) a pair of electrode layers formed on said pair of dielectric layers;
      inner opposing ends of said pair of electrode layers being contacted with said MR layer, thereby electrically connecting said pair of electrode layers to said MR layer;
      a distance between said inner opposing ends of said pair of electrode layers being smaller than a width of said MR layer; and
      wherein each of said inner opposing ends of said pair of dielectric layers being located between one of said innermost ends of said pair of electrode layers and a corresponding one of said innermost ends of said pair of vertical biasing layers;
  (ii) means for generating a current flowing through said element; and
  (iii) means for sensing an electrical resistance change of said element as a function of a magnetic field to be sensed by said element; and
(c) actuator means for moving said magnetic recording subsystem and said MR sensing system to a selected one of said tracks of said medium;
said actuator means being associated with said magnetic recording subsystem and said MR sensing system.

9. A magnetic storing system comprising:
(a) a magnetic recording subsystem for recording information in a magnetic recording medium having information-recording tracks;
(b) a MR sensing system, said MR sensing system including:
  (i) a MR element, said element including:
    (A) a MR layer;
    (B) a pair of vertical biasing layers disposed at each side of said MR layer to be overlapped with each end of said MR layer;
      inner opposing ends of said pair of vertical biasing layers being contacted with said MR layer;
    (C) a pair of electrode layers formed on said pair of biasing layers;
      innermost ends of said pair of electrode layers being located more inwardly than innermost ends of said pair of vertical biasing layers;
      said pair of electrode layers being electrically connected to said MR layer; and
    (D) a pair of dielectric layers formed to overlap with said pair of biasing layers and said MR layer;
      each of innermost ends of said pair of dielectric layers being located between one of said innermost ends of said pair of electrode layers and a corresponding one of said innermost ends of said pair of vertical biasing layers;
  (ii) means for generating a current flowing through said element; and
  (iii) means for sensing an electrical resistance change of said element as a function of a magnetic field to be sensed by said element; and
(c) actuator means for moving said magnetic recording subsystem and said MR sensing system to a selected one of said tracks of said medium;
said actuator means being associated with said magnetic recording subsystem and said MR sensing system.

* * * * *